United States Patent
Matsui et al.

(10) Patent No.: US 10,614,992 B2
(45) Date of Patent: Apr. 7, 2020

(54) ELECTROSTATIC LENS, AND PARALLEL BEAM GENERATION DEVICE AND PARALLEL BEAM CONVERGENCE DEVICE WHICH USE ELECTROSTATIC LENS AND COLLIMATOR

(71) Applicant: NATIONAL UNIVERSITY CORPORATION NARA INSTITUTE OF SCIENCE AND TECHNOLOGY, Nara (JP)

(72) Inventors: Fumihiko Matsui, Nara (JP); Hiroyuki Matsuda, Nara (JP)

(73) Assignee: National University Corporation Nara Institute of Science and Technology, Nara (JP)

( * ) Notice: Subject to any disclaimer, the term of this patent is extended or adjusted under 35 U.S.C. 154(b) by 0 days.

(21) Appl. No.: 15/744,769

(22) PCT Filed: Jul. 13, 2016

(86) PCT No.: PCT/JP2016/070744
§ 371 (c)(1),
(2) Date: Jan. 13, 2018

(87) PCT Pub. No.: WO2017/010529
PCT Pub. Date: Jan. 19, 2017

(65) Prior Publication Data
US 2018/0211812 A1    Jul. 26, 2018

(30) Foreign Application Priority Data
Jul. 15, 2015   (JP) ................................ 2015-141687

(51) Int. Cl.
*H01J 37/05* (2006.01)
*H01J 49/44* (2006.01)
(Continued)

(52) U.S. Cl.
CPC ............ *H01J 37/05* (2013.01); *G01N 23/227* (2013.01); *H01J 37/075* (2013.01); *H01J 37/09* (2013.01);
(Continued)

(58) Field of Classification Search
CPC .................................................. G01N 23/227
See application file for complete search history.

(56) References Cited

U.S. PATENT DOCUMENTS 4,764,673 A    8/1988  Bryson et al.
6,492,644 B1 * 12/2002 Staib ...................... H01J 37/05
250/287
(Continued)

OTHER PUBLICATIONS

"International Search Report", PCT/JP2016/070744, dated Oct. 18, 2016, 2 pages.
(Continued)

*Primary Examiner* — Michael J Logie
(74) *Attorney, Agent, or Firm* — Ogilvie Law Firm

(57) ABSTRACT

Provided is a compact device which captures, over a large solid angle range, electrically charged particles emitted from a point source and parallelizes the trajectories of said charged particles. The present invention is configured from: an electrostatic lens comprising a plurality of axisymmetric electrodes (10-14) and an axisymmetric aspherical mesh (2) which has a surface that is concave away from the point source; and a flat collimator plate (3) positioned coaxially with the electrostatic lens. The acceptance angle for the electrically charged particles generated from a point source (7) is ±30° or greater. The shape of the aspherical mesh (2), and the potentials and the positions of a ground electrode (10) and application electrodes (11-15) are adjusted so that the trajectories of the electrically charged particles are substantially parallelized by the electrostatic lens. The elec-
(Continued)

trostatic lens and the flat collimator plate are positioned on a common axis.

16 Claims, 20 Drawing Sheets

(51) Int. Cl.

| | | |
|---|---|---|
| *H01J 37/075* | (2006.01) | |
| *H01J 37/09* | (2006.01) | |
| *H01J 37/12* | (2006.01) | |
| *H01J 37/244* | (2006.01) | |
| *H01J 37/252* | (2006.01) | |
| *H01J 37/305* | (2006.01) | |
| *G01N 23/227* | (2018.01) | |
| *H01J 49/48* | (2006.01) | |
| *H01J 49/06* | (2006.01) | |
| *H01J 43/24* | (2006.01) | |

(52) U.S. Cl.
CPC .......... *H01J 37/12* (2013.01); *H01J 37/244* (2013.01); *H01J 37/252* (2013.01); *H01J 37/305* (2013.01); *H01J 43/24* (2013.01); *H01J 49/06* (2013.01); *H01J 49/488* (2013.01)

(56) References Cited

U.S. PATENT DOCUMENTS

| | | | |
|---|---|---|---|
| 7,928,381 B1 | 4/2011 | Kelly et al. | |
| 2002/0173045 A1* | 11/2002 | Schwartz | C12Q 1/68 |
| | | | 436/164 |
| 2003/0230986 A1 | 12/2003 | Horsky et al. | |
| 2008/0251713 A1* | 10/2008 | Tsukihara | H01J 37/045 |
| | | | 250/282 |
| 2010/0001202 A1* | 1/2010 | Matsuda | H01J 37/12 |
| | | | 250/396 R |
| 2010/0163725 A1* | 7/2010 | Barkshire | H01J 37/05 |
| | | | 250/305 |
| 2016/0071690 A1 | 3/2016 | Shintake | |
| 2016/0172157 A1* | 6/2016 | Qiao | H01J 37/252 |
| | | | 250/310 |

OTHER PUBLICATIONS

Tóth, László, et al., "Details of 1π sr wide acceptance angle electrostatic lens for electron energy and two-dimensional angular distribution analysis combined with real space imaging," Nuclear Instruments and Methods in Physics Research, Section A, Sep. 21, 2011, vol. 661, Issue 1, pp. 98-105.

Matsuda, H., et al, "Development of display-type ellipsoidal mesh analyzer: Computational evaluation and experimental validation", Journal of Electron Spectroscopy and Related Phenomena, May 13, 2014, vol. 195, pp. 382-398.

Matsuda, H., et al, "Approach for simultaneous measurement of two-dimensional angular distribution of charged particles: Spherical aberration correction using an ellipsoidal mesh", Physical Review E, Jun. 28, 2005, vol. 71, 066503, 8 pages.

"Supplementary European Search Report", EP 16824509, dated Feb. 25, 2019, 5 pages.

Tóth, László, et al., "Simple method for making deeply curved mesh," doi:10.1016/j.elspec.2009.02.013, 2009, 4 pages.

* cited by examiner (1)          (2)

ELECTROSTATIC LENS, AND PARALLEL BEAM GENERATION DEVICE AND PARALLEL BEAM CONVERGENCE DEVICE WHICH USE ELECTROSTATIC LENS AND COLLIMATOR

TECHNICAL FIELD

The present invention relates to an electrostatic lens, a parallel beam generating apparatus using said electrostatic lens and a collimator, and a parallel beam converging apparatus, and more specifically to electron spectrometers such as an XPS (X-ray photoelectron spectroscopy) and an AES (Auger electron spectroscopy) measurement apparatus, electron beam diffracting devices such as a LEED (low-energy electron diffraction) and a PED (photoelectron diffraction) measurement apparatus and an ion desorption angle distribution measurement apparatus.

BACKGROUND ART

A retarding-voltage-type energy analyzer combining a plural number of grids in the conventional concentrically spherical shape and a fluorescent screen is widely used for low-energy electron diffraction observation and Auger electron spectroscopy measurement. However, there has been a problem that the signal amplification cannot be performed using a planer microchannel plate because charged particles are projected onto a spherical surface due to usage of grids of concentric sphere. In addition, there has been a problem that the retarding-voltage-type energy analyzer shows a poor signal-to-background ratio due to the high-pass-filter effect resulting in unsuitability for a two-dimensional angle distribution measurement such as photoelectron diffraction. In view of this, a retarding-voltage-type energy analyzer which projects the two-dimensional angle distribution on a plane using electrodes of axially symmetric electrodes was proposed (Refer to Patent literature 1 and 2). However, the acceptance angle of the charged particles generated at the point source was limited to ±10°.

In addition, the fluorescent X-ray becomes an obstacle when a retarding-voltage-type energy analyzer is utilized for a measurement of photoelectron diffraction measurement. There has been a problem that the X-ray cannot be removed at the retarding voltage and the fluorescent X-ray dosage increases as the acceptance angle for charged particles is enlarged, which becomes a background noise.

On the other hand, an electrostatic lens is often used at the incident part of an energy analyzer in an apparatus for electron spectroscopy and this electrostatic lens takes in as much electrons as possible and lets the electrons enter into the analyzer after decelerating the electrons, thus the energy resolution capability can be improved. Not only in the apparatus for electron spectroscopy but also in the surface analysis and further in the fundamental research of solid state physics, a technology that enables measurement over a large solid angle range by making the acceptance angle of charged particles wider is demanded because the measurement sensitivity is determined by the extent of the area of the solid angle wherein the charged particles can be accepted in case of such as electron spectroscopy measurement by electrons emitted from the crystal surface, electron diffraction, and ion desorption angle distribution measurement.

Also, if the acceptance angle of the charged particles is less than ±30°, an atomic arrangement structure analysis such as photoelectron diffraction and photoelectron holography is difficult but the atomic arrangement structure analysis becomes possible if the measurement of the large solid angle with the acceptance angle equal to or larger than ±30° is possible.

In ordinary electrostatic lenses, the acceptance angle is limited to about ±20° due to the difficulty of focusing the beam of a large opening angle on one point due to the spherical aberration, however, the acceptance angle has been improved to about ±30° because it is possible to increase the sensitivity by using a spherical mesh (Refer to Patent literature 3).

Also, a spherical aberration correction electrostatic lens capable of realizing a larger acceptance angle than using a spherical mesh is known by creating an optimum electric field using a plural number of electrodes, applying the negative spherical aberration correction effect of the aspherical mesh (Refer to Patent literature 4).

However, as shown in FIG. 21, in the spherical aberration correction electrostatic lens 100 as disclosed in Patent literature 4, an aspherical mesh 106 being shaped as an optically symmetrical spheroid having a concave shape against a sample surface 110 positioned so that an enlarged virtual image having a negative spherical aberration is to be formed, and a plural number of electrodes (101~105) consisting of a concentric surface for forming a convergence electric field that generates positive spherical aberration that forms a real image of the enlarged virtual image, are being positioned in the configuration and thus the lens itself becomes large-scaled with the distance from the sample surface 110 to the light exit portion 107 being large (L=about 0.5 mm) and resultantly the ultra-high vacuum electromagnetic field shielding chamber (not shown) for storing the sample surface 110 and the aspherical aberration compensation electrostatic lens 100 entirely became enlarged. In addition, the emitted beam becomes a point light source beam with a narrow solid angle due to the influence of convergence electric field that generates equilateral spherical aberration and the beam is emitted from the beam exiting opening 107 and accordingly, in the case wherein the emitted light source beam is projected on a fluorescent screen for energy analysis, it has been difficult to achieve the compactification of the whole apparatus because it is necessary to make the point charged-particle beam needs to be converged once at the exit slit in the case, for example, wherein the electrons emitted from the exiting opening 107 are analyzed by the retarding voltage or the deflection electric field (not shown) and the angle distribution is projected on a fluorescent screen (Not shown).

PRIOR ART

Patent Literature

[Patent literature 1] U.S. Pat. No. 6,492,644
[Patent literature 2] U.S. Pat. No. 6,198,095
[Patent literature 3] JP1996-111199A
[Patent literature 4] JP4802340B

OUTLINE OF THE INVENTION

Problems to be Solved by the Invention

As described above, the acceptance angle has been limited to about ±20° due to spherical aberration in ordinary electrostatics lenses, however, it is possible to increase the sensitivity by using a spherical mesh and furthermore, lenses that adapt the negative spherical aberration correction of non-spherical mesh can realize a larger acceptance angle by producing an optimum electric field using a plural number of electrodes.

However, the size of the lens that converges beams using convergence electric field that generates positive aberration by applying negative spherical aberration compensation of the non-spherical mesh is large, which is a shortcoming that a large space is required when the lens is integrated into an apparatus such as an electronic spectroscopic apparatus.

In view of such a situation, the present invention aims to provide an electrostatic lens and a compact parallel beam generating device capable of capturing charged particles emitted from a point source over a large solid angle range and collimating the trajectory of charged particles.

Also, the present invention aims to provide an apparatus which realizes high sensitivity and high energy resolution of photoelectron diffraction angular distribution by collimating emitted charged-particle beams having large solid angles.

It is another object of the present invention to provide a compact parallel beam converging apparatus capable of concentrating a collimated charged particle stream having a specific kinetic energy to a single point by using the above electrostatic lens.

Means to Solve the Objects

In order to solve the above problems, the electrostatic lens of the present invention consists of an axisymmetric or substantially axisymmetric non-spherical mesh having a concave surface toward a point source or a converging point, and a single or a plural number of electrodes axisymmetric or substantially axisymmetric and is characterized by the features (a)~(d) below. By providing such features, the charged particles emitted from a point source can be taken in over a large solid-angle range and the trajectory of the charged particles can be collimated.

(a) Aspheric mesh is a spheroid having a major axis extending from the vicinity of the central of the mesh opening to the mesh center, or a substantial spheroid having a shape with its mesh opening expanding inwardly with a convex curvature.

(b) The ratio of the opening radius of the mesh electrode connected to the mesh to the opening radius of the first electrode adjacent to the mesh electrode among the single or the plural number of electrodes is equal to or more than 1.2 and equal to or less than 1.6.

(c) The ratio of the major axis radius to the minor axis radius in the spheroid is greater than 1.0 and or equal to or less than 2.0.

(d) The acceptance angle of the charged particles generated at the point source is ±60°, and the trajectory of the charged particles is made parallel with a deviation angle of equal to or less than ±1°.

In the electrostatic lens of the present invention, the number of electrodes is to exclude the mesh electrodes and the reduction ratio is defined as the ratio of the kinetic energy at the time of charged particle generation to the kinetic energy at the terminal electrode, satisfying either one of 1)~5) below.

1) In a case wherein the number of electrodes is 1 and the reduction ratio is equal to or more than 0.1 and equal to or less than 0.3, the ratio of the major axis radius to minor axis radius in the spheroid is equal to or more than 1.69 and equal to or less than 1.89.

2) In a case wherein the number of electrodes is 2 and the reduction ratio is equal to or more than 0.1 and equal to or less than 0.3, the ratio of the major axis radius to minor axis radius in the spheroid is equal to or more than 1.56 and equal to or less than 1.76.

3) In a case wherein the number of electrodes is 3 and the reduction ratio is equal to or more than 0.1 and equal to or less than 0.3, the ratio of the major axis radius to minor axis radius in the spheroid is equal to or more than 1.52 and equal to or less than 1.72.

4) In a case wherein the number of electrodes is 4 and the reduction ratio is equal to or more than 0.1 and equal to or less than 0.3, the ratio of the major axis radius to minor axis radius in the spheroid is equal to or more than 1.49 and equal to or less than 1.69.

5) In a case wherein the number of electrodes is equal to or more than 5 and the reduction ratio is equal to or more than 0.1 and equal to or less than 0.3, the ratio of the major axis radius to minor axis radius in the spheroid is equal to or more than 1.39 and equal to or less than 1.59.

Furthermore, in the electrostatic lens of the present invention, regardless of the number of electrodes, the ratio of the major axis radius to the minor axis radius in the spheroid is preferably greater than 1.0 and less than 1.5 when the reduction ratio is equal to or more than 0.01 and less than 0.1.

In the electrostatic lens according to the present invention, the mesh shape of the substantial spheroid, when compared with the shape of a spheroid with the same long axial length and the short axial length, the deviation of the radial direction from the major axis is equal to or less than 5% of the radial distance and an inflection point exists in the plot of the first order differentiation regarding the angle of the discrepancy in the above radial direction at the position at a position where the angle formed by the axis connecting the point source and the mesh-shaped surface and the major axis is larger than 40°.

Furthermore, in the electrostatic lens of the present invention, it is preferable that the mesh shape of the substantial spheroid is represented by $d_{mesh}$ expressed by the following numerical formula 1, which is a polynomial function. Here, in the formula 1 below, $d_{mesh}$ is the distance from the point source to the mesh surface position, the distance $d_1$ is the distance from the point source to the tip position of the mesh on the analyzer symmetric axis, the distance $d_2$ is the distance from the point source to the edge position of the mesh, the angle $\theta$ and $\theta_{max}$ are polar angles from the analyzer symmetric axis for determining the surface and the edge position of the mesh, respectively, $\alpha$ is a function of $\theta$, n is the number of dimensions of the function and w is a parameter decided by parameters $a_1$~$a_n$.

[Equation 1]

$$d_{mesh} = d_2 + (d_1 - d_2) \sum_{i=1}^{n} (a_i/w)\cos^{(i)}\alpha \tag{1}$$

$$\left(\alpha = \frac{\pi}{2}\theta/\theta_{max}, w = a_1 + a_2 + \ldots + a_n\right)$$

Next, the parallel beam generating apparatus according to the present invention is explained.

The parallel beam generating apparatus according to the present invention comprises the electrostatic lens according to the present invention described above and a planar collimator plate positioned coaxially with the lens. And acceptance angle of the charged particles generated at the point source is ±60° and the trajectory of the charged particles is made parallel to the analyzer symmetric axis with a deviation angle from the analyzer symmetric axis equal to or less than ±1°. And the electrostatic lens and the planar collimator plate are arranged coaxially so that the charged particle is made incident substantially perpendicular to the planar collimator plate after the trajectory of the charged particle is made parallel to the axis.

According to the configuration above, it is possible to realize a compact apparatus that captures charged particles emitted from a point source over a large solid angle and collimates trajectories of charged particles with high parallelism. The parallel beam generating apparatus according to the present invention can be miniaturized, the magnetic shielding ultra-high-vacuum chamber surrounding the apparatus can also be reduced, and the apparatus cost also can be suppressed.

The electrostatic lens according to the present invention captures charged particles emitted from a point source over a large solid angle range and collimates the trajectory of charged particle with high parallelism. The parallelism of the collimated charged particles is further improved by being made incident substantially perpendicular to the planar collimator plate.

Here, the planar collimator plate selects only collimated beams by taking in beams through a narrow slit and a small pore formed at a flat plate.

The parallel beam generating apparatus according to the present invention can analyze electrons if a negative potential is applied to the electrode and can analyze positive ions if appositive a positive potential is applied to the electrode. The electrode potential is stably controlled with an accuracy of equal to or less than 50 mV with respect to the DC power source of 1 KV.

The above-mentioned planar collimator plate is characterized by functioning as a band-pass filter for selecting only charged particles of specific kinetic energy.

By functioning as a band-pass filter, the intensity distribution projected on the screen using the fluorescent screen can be handled as data of angular distribution pattern of specific energy. The resolution of the band-pass filter is somewhere around $\Delta E/E=0.5 \sim 1\%$.

For the planar collimator plate to function as a band-pass filter, it is necessary for the above-mentioned electrostatic lens to parallelize only the trajectory of charged particles of specific energy being made incident on the planar collimator plate.

In the parallel beam generating apparatus according to the present invention, a planar microchannel plate in which minute photomultipliers are bundled on a flat plate is further arranged so that charged particles having specific kinetic energy emitted from the above-mentioned planar collimator may be amplified by the avalanche current.

By amplifying with the avalanche current, a high sensitivity measurement becomes possible.

The planar collimator plate in the parallel beam generating apparatus according to the present invention, is preferably combined with pores having an aspect ratio (ratio of pore diameter to pore length) of 1:5 to 1:20 with an pore opening ratio of 50% or more.

The greater the aspect ratio is, the parallelism of the beam emitted from the planar collimator plate becomes higher. Also, it is better that the pore opening ratio is larger because the pore opening ratio affects the transmittance.

For example, in the case wherein the aspect ratio is 1:10 and the pore opening ratio is more than 50%, the upper limit of the angle resolution becomes 0.1° (the angular resolution becomes about) 0.1° when the pore diameter is 50 μm with respect to the collimator diameter being 50 mm. The radius 25 mm of the collimator corresponds to the emission angle of 50° and the upper limit of the angular resolution becomes 50°/(25 mm/50 μm)=50°/500=0.1°.

The parallel beam generation apparatus according to the present invention may further be furnished with the electrode and a sweeping means mentioned above for sweeping the potential of the planar collimator plate.

By sweeping the potential of the electrode and the planar collimator plate, the spectrum of angular distribution for the charged particle can be measured effectively.

In the parallel beam generating apparatus according to the present invention mentioned above, a fluorescent screen and camera means may be further furnished to measure the charged particle of specific energy emitted for the planar collimator plate mentioned above may be measured by imaging using the camera means after converting to light spots on the fluorescent screen.

The charged particles of a specific kinetic energy are converted to bright spots on the fluorescent screen and can be measured by imaging as a two-dimensional distribution pattern by the camera. Also, the planar collimator plate plays a role of an exit slit when projecting an angular distribution on the fluorescent screen. A small size and easy to use projection-type analyzer can be realized and this analyzer can be utilized for various types of analyses. Thus the apparatus can be used as an angular distribution measurement.

In the angular distribution measurement analyzer, a delayed-line detector may be further furnished so that the emission angle direction and the arrival time of each charged particle of a specific kinetic energy emitted from the planar collimator plate mentioned above may be individually measured by the delayed-line detector so that the time resolution image measurement may be accomplished.

By providing a pulse excitation source and the delayed-line detector synchronized therewith, the emission angle direction and the arrival time of each charged particle of a specific kinetic energy emitted from the planar collimator plate mentioned above may be individually measured by the delayed-line detector so that the time-resolved angular distribution measurement may be accomplished. Herewith, in addition to the measurement of the emission angle distribution of the charged particles, the time information when each particle is emitted after its excitation can be simultaneously and advantageously obtained.

In the angle distribution measurement and analysis apparatus mentioned above, a retarding-voltage plane grid may be further provided for performing the lock-in detection of the change of current by the charged particles passing through the grid by changing the DC voltage applied to the grid, thus detecting the charged particles of a specific kinetic energy emitted from the planar collimator plate.

Measurement with higher energy resolution ($\Delta E/E=0.01$ to 0.1%) can be realized by the lock-in detection by combining with a retarding-voltage plane grid. The energy resolution of the band-pass filter by the planar collimator plate becomes relative value, and in the case of 1% energy resolution, the resolution becomes 1 eV against 100 eV and 10 eV against 1 keV. Also, the measurement energy resolution by lock-in detection becomes an absolute value determined by the modulation electric field, and in the case of modulation electric field of 100 mV, the resolution becomes 0.1% becomes 0.1% against 100 eV and 0.01% against 1 keV. In the conventional blocking electric field type apparatus, the lock-in detection uses the modulation electric field of 1 V to 10 V because the S/B ratio (Signal/Background ratio) is poor and also the amplification by the planar microchannel plate cannot be conducted. The band-pass system using the planar collimator plate according to the present invention makes it possible to reduce the modulation electric field as low as 100 mV because high S/B ratio and high amplification are possible.

The angle distribution measurement and analysis apparatus mentioned above is either one of an apparatus for electron spectroscopy, an electron diffraction apparatus, a photoelectron spectrometer, a photoelectron diffraction apparatus, a positron spectroscopy apparatus, a positron diffraction apparatus, an ion desorption angle distribution measurement apparatus, a crystal structure analysis apparatus, a material surface analysis apparatus and a solid physical property analysis apparatus, in which the parallel beam generating apparatus according to the present invention is incorporated into as an emission angle distribution analyzing apparatus of the charged particle energy.

In the precision ion etching apparatus according to the present invention, the parallel beam generation apparatus according to the present invention as described above is incorporated as a single-energy large-diameter parallel-ion-beam source and performs ion etching or ion sputtering.

Conventionally, when ion sputtering was performed on a sample surface of a large area, the focused ion beam is two-dimensionally scanned or non-focused to increase the beam diameter, but in either case, the beam does not irradiate the sample surface perpendicularly at the place distant from the center and accordingly, in the case of pattern processing using a mask, for example, the edge portion becomes dull and molding of high aspect ratio was difficult. In the parallel beam generating apparatus according to the present invention, ions can be taken in over a large solid angle range and a large-diameter parallel ion beam of a single kinetic energy can be generated and surface irradiation of the thus generated large-diameter parallel ion beam makes it possible to perform high aspect ratio molding without the edge portion becoming dull at the time of pattern processing using a mask, making precise shape control etching possible.

The large-solid-angle X-ray detector according to the present invention is to amplify electrons generated at the planar collimator plate with the planar collimator plate being negative potential and the fluorescent screen being positive potential at the parallel beam generating apparatus furnished with a fluorescent screen and camera means according to the present invention.

According to such a configuration, an X-ray detector over a large solid angle can be realized.

According to another aspect of the present invention, a parallel beam converging apparatus is provided. The parallel beam converging apparatus is configured with the electrostatic lens according to the present invention described above and the planar collimator plate positioned coaxially with the electrostatic lens and the electrostatic lens so that the trajectory after the emission of the charged particle of a specific kinetic energy is converged at the focus point by the electrostatic lens.

When the entrance and the exit are reversed in the parallel beam generating apparatus according to the present invention mentioned above, such apparatus can be utilized as a parallel beam focusing apparatus which concentrates particles of only a specific energy to one point and measures the intensity by taking out charged particle flow in a specific direction by a collimator plate.

The planar collimator plate in the parallel beam convergence apparatus from other viewpoint of the present invention may be provided with the pore opening ratio of 50% or more constituted by pores with aspect ratios (ratio of pore diameter to pore length) from 1:5 to 1:20.

The charged particle flow direction/energy measuring apparatus according to the other aspects of the present invention is configured with a plural number of parallel beam converging apparatuses according to the present invention as mentioned above, the planar collimator functions as a band-pass filter that selects only charged particles of a specific kinetic energy, extracts a charged particle flow in a specific direction by a planar collimator plate and measures the energy intensity by focusing only the particle of a specific energy to one point using an electrostatic lens.

Effects of the Invention

According to the parallel beam generation apparatus of the present invention, there is an effect that the intensity angle distribution of the charged particles of specific kinetic energy emitted from the sample can be projected on plane up to a solid angle of about ±60°. Since the sensitivity is proportional to the solid angle, it is possible to improve the sensitivity the sensitivity and function remarkably. That is to say that it becomes possible to collimate a radiation with a large solid angle, and it becomes possible to achieve high sensitivity and high energy resolution of photoelectron diffraction angle distribution.

According to the parallel beam generating apparatus of the present invention, energy resolution at the planar collimator plate can be improved by making the excitation beam small, for example, when a convergent beam of 100 μm or less is used as the excitation beam, the energy resolution of 1.0~0.5% can be effectively achieved.

Also, the parallel bam generation apparatus of the present invention can be downsized and can be easily incorporate in other analyzing apparatuses. For example, a combination with SEM (Scanning Electron Microscope) can realize an element selective crystal structure observation that selects only specific energy.

Further, according to the parallel beam converging apparatus of the present invention by making the entrance and the exit reversed in the parallel beam generation apparatus mentioned above, the charged particle flow in a specific direction is taken out by the collimator plate and only the particles of specific energy can be focused on one point with an electrostatic lens and the intensity can be measured.

BEST MODE FOR CARRYING OUT THE INVENTION

Embodiments of the present invention will be described in detail below with reference to the drawings. The present invention is not limited to the following embodiment and examples of shown in the figure, and the present invention can be variously changed in design.

Embodiment 1

Figure 1:
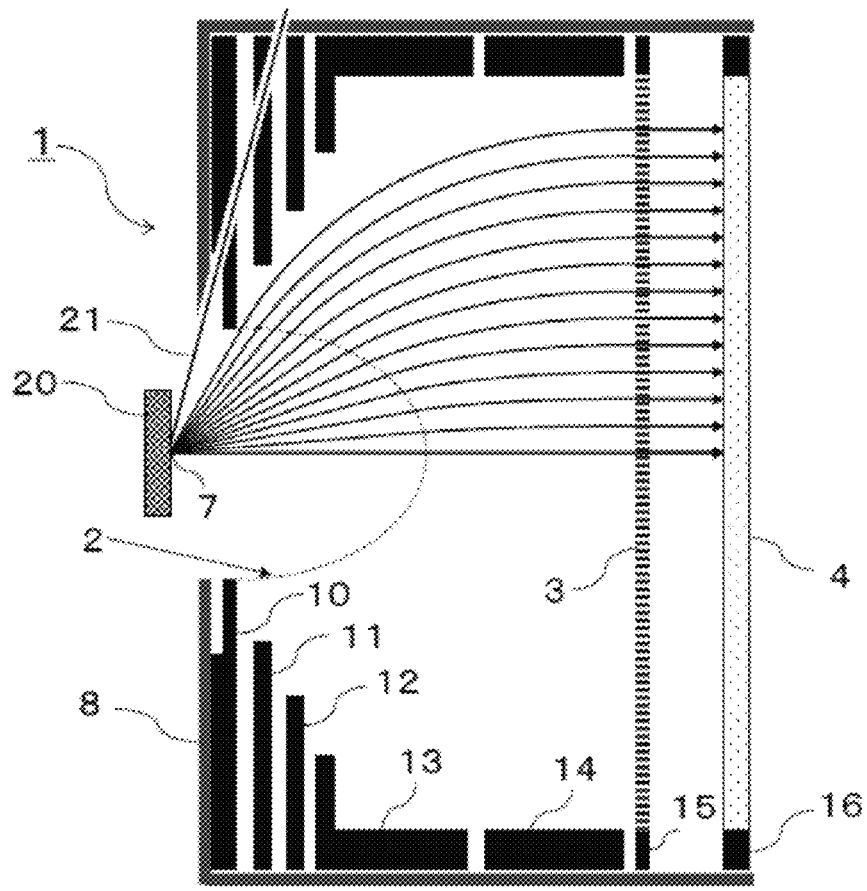
FIG. 1 shows a configuration diagram of a parallel beam generation apparatus in Embodiment 1.

FIG. 1 shows an one embodiment of the parallel beam generation apparatus of the present invention. The parallel beam generation apparatus of the present invention is configured with a electrostatic lens of the present invention comprising of an axially symmetric aspherical mesh 2 having a concave shape with respect to the point source 7 and an electrostatic lens of this invention constituting five axially symmetric electrodes (10~14), planar collimator plate 3 positioned coaxially with the electrostatic lens, a fluorescent screen 4 and a magnetic shielding cover 8 for housing those mentioned above.

When the sample surface 20 is irradiated by the excitation beam, charged particles (electrons or ions) are emitted from the point source 7 serving as the irradiation point with a specific opening angle.

In the parallel beam generating apparatus of this embodiment, the acceptance angle of the charged particles generated at the point source 7 is about ±58° and the mesh shape of the aspherical mesh 2 and the potential and the arrangement of 5 electrodes (10~14) are adjusted so that the trajectory of the charged particles is collimated by the electrostatic lens. And the electrostatic lens and the planer collimator 3 are arranged to be coaxial so that the charged particles enter perpendicularly on the planar collimator plate 3 after the trajectory of the charged particles is placed coaxially against the axis.

The excitation beam is irradiated on the sample surface 20 through the excitation beam guide 21 so that there is no interference with the charged particles generated at the point source 7. In the case where the acceptance angle of the charged particles generated at the point source 7 is about ±58°, the excitation beam guide tube 21 is positioned so that the incident angle of the excitation beam becomes more than 75° with respect to the sample surface 20.

As shown in FIG. 1 the fluorescent screen 4 is positioned and the charged particles of a specific kinetic energy emitted from the planar collimator 3 are converted to bright spots by the fluorescent screen 4, which is converted to an image by a camera, which enables to measure the energy distribution.

Figure 2:
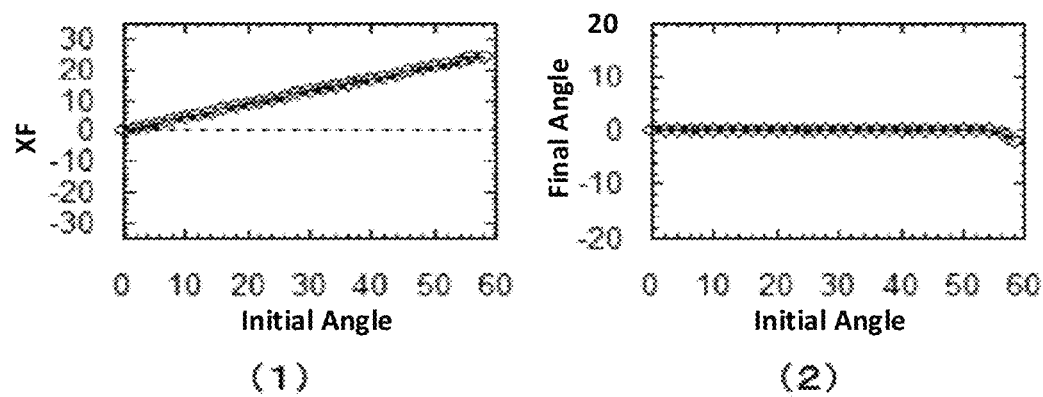
FIG. 2 shows an explanation diagram of an acceptance angle from a point source and a trajectory of a charged particle.

The acceptance angle from a point source and the trajectory of the charged particle are explained by referencing FIG. 2. The horizontal axis (Initial angle) in FIGS. 2 (1), (2) represents the acceptance angle (the solid angle) of the charged particle emitted from the point source, the vertical axis of FIG. 2 (1) represents the distance (X f) from the collimator center and the vertical axis (Final angle) in FIG. 2 (2) represents the angle of the trajectory of the charged particle incident on the planar collimator plate 3. The angles are both the angle from the axis perpendicular to the sample surface. In the parallel beam generating apparatus according to the embodiment here, the range of the acceptance angle wherein collimating can be performed is 0~±58° and regarding the charged particles emitted from the point source, out of charged particles with the initial angle being 0~60°, the angle of the charged particle trajectory is 0° up to about 58° (i.e. parallel to the axis), however, when it becomes larger than 58°, the angle deviates from 0, showing it being not parallel.

For example, a case wherein a single crystal surface being as a sample surface 20, using an X-ray as an excitation beam, and electrons are emitted from a light source 7 is explained. In the parallel beam generation apparatus according to this embodiment, the electron beam can be collimated with the range of the acceptance angle range being 0~±58° at the energy of the electron emitted for the point source 7 being 1000 eV.

Figure 3:
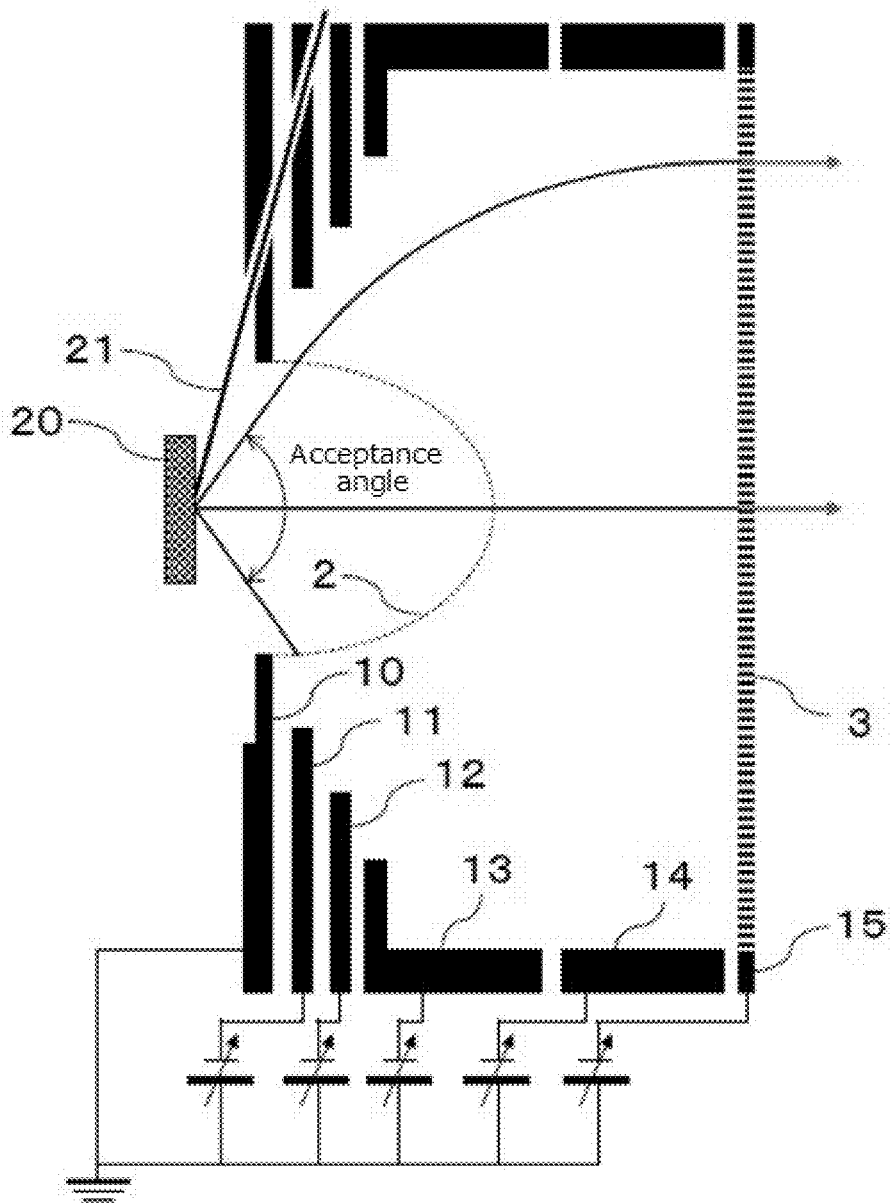
FIG. 3 shows an explanation diagram of electrode placement and potential.

One example of electrode placement and potential is explained. Each electrode 10 to 15 is a coaxial ring-shaped electrode. Among the five electrodes (10~14) that constitutes the electrostatic lens, as shown in FIG. 3, the electrode 10 is connected to the aspheric mesh 2 and connected to the ground so as to be 0 V. This is for making this potential the same potential as the sample surface 20. The three electrodes 1113 are arranged so as to go away from the point source 7 in order and the length of the electrode is made shorter. The electrode 14 is positioned at the farthest position and has a shape extending along the axial direction. And, the electrode 15 is connected to the planar collimator plate 3.

In the case where the electron beam with energy of x keV is collimated, the potential of each electrode is 0 V for the electrode 10, −520×V for the electrode 11, −780×V for the electrode 12, −888×V for the electrode 13, −914.5×V for the electrode 14 and −950×V for the electrode 15.

Figure 4:
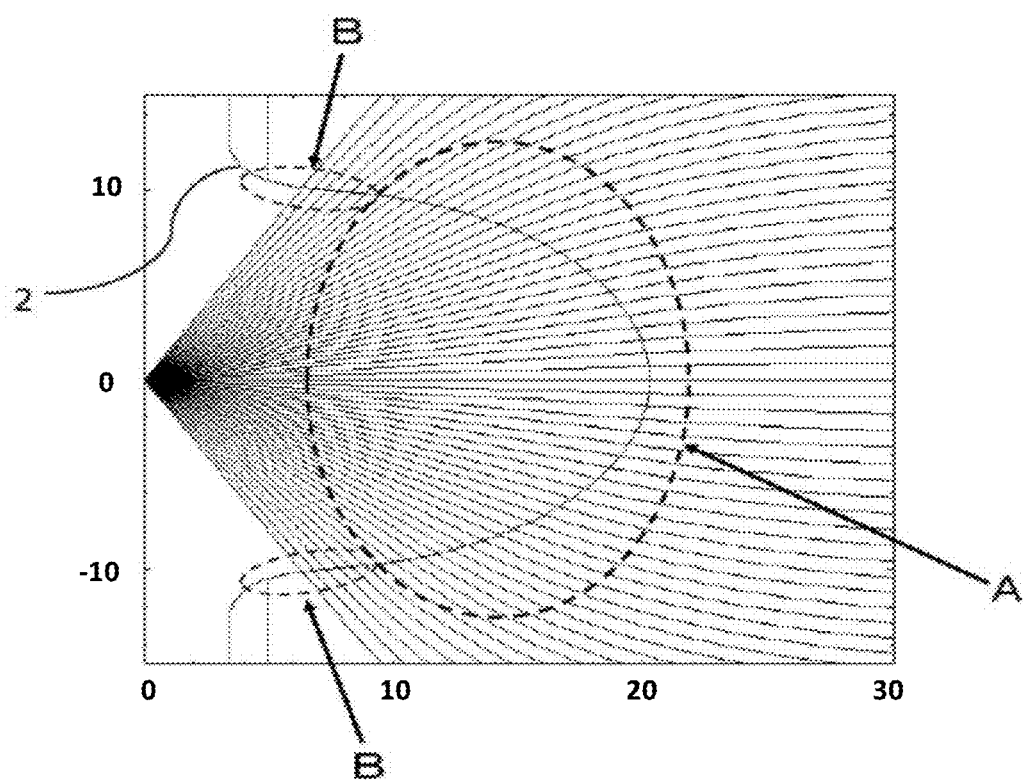
FIG. 4 shows an explanation diagram of a shape of the aspherical mesh.

Next, the shape of the aspherical mesh is explained by referencing FIG. 4. The aspherical mesh 2 has a shape of substantial spheroid (A in the drawing) with the major axis starting from the vicinity of the center of the mesh opening to the center of the mesh, and the vicinity of the mesh opening (B in the drawing) has a shape spreading inwardly with a convex curvature.

In order to generate an electric field so that the force in the direction of the center axis increases relatively against the charged particles emitted for the point source, the shape of the mesh is not spherical but is close to spheroidal having a major axis in the axial direction.

Figure 5:
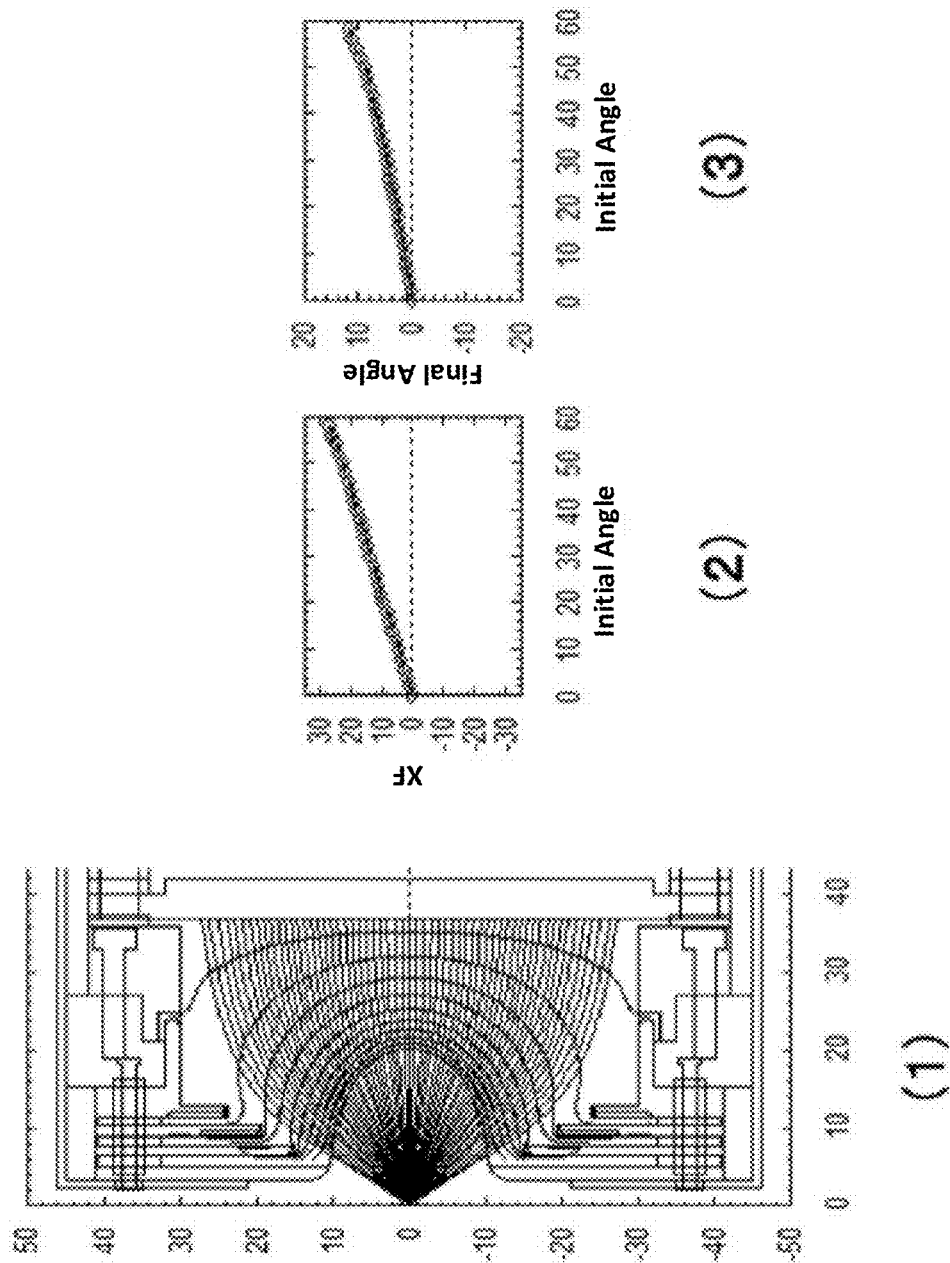
FIG. 5 shows an explanation diagram (1) of a trajectory of electrons with different energy.
Figure 6:
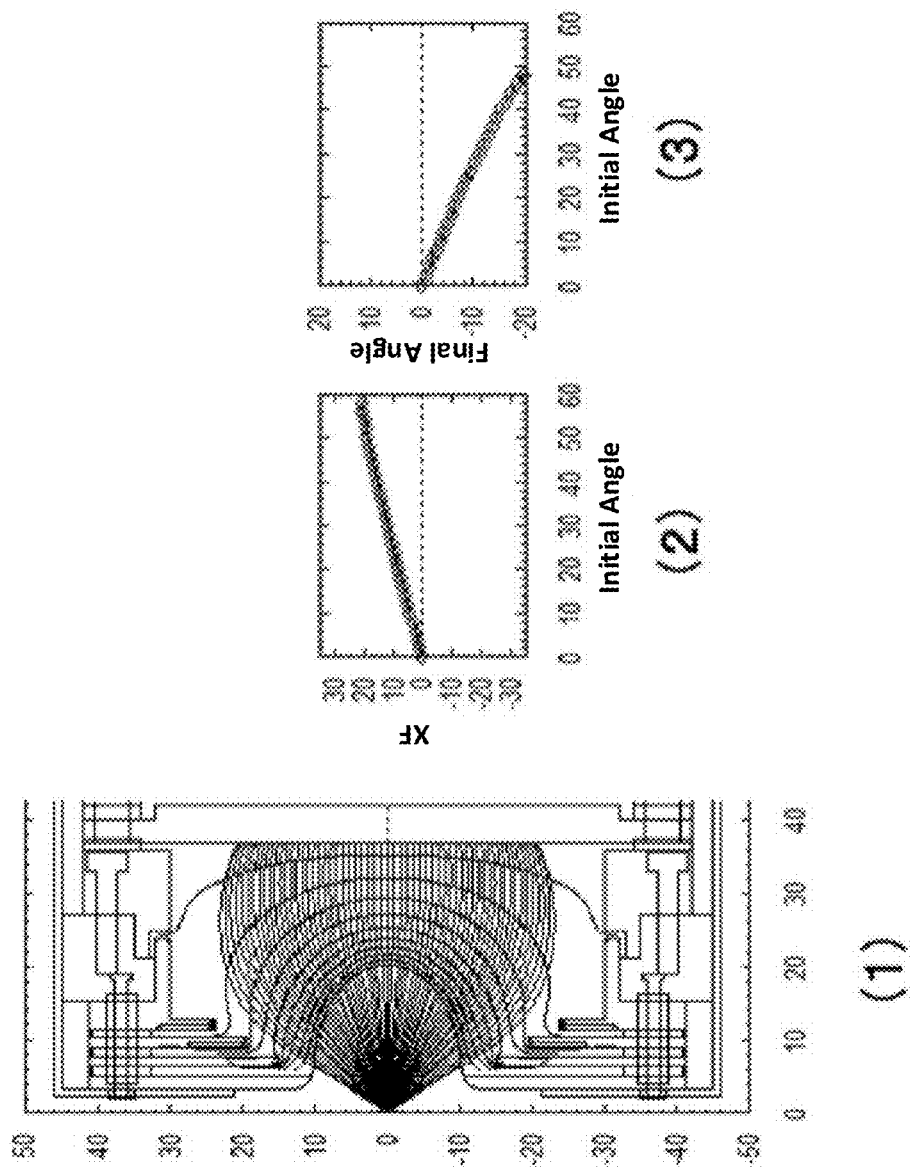
FIG. 6 shows an explanation diagram (2) of a trajectory of electrons with different energy.

The trajectory of electrons with energy different from 1000 eV but with the same electrode placing and the potential in the parallel beam generation apparatus shown in FIG. 1 is explained by referencing FIG. 5 and FIG. 6.

FIG. 5 shows the trajectory of the electors with energy of 1030 eV and FIG. 6 shows the trajectory of electrons with energy of 970 eV.

The potential of each electrode, similarly as the case shown in FIG. 1, are 0 V for the electrode 10, −520 V for the electrode 11, −780 V for the electrode 12, −888 V for the electrode 13, −914 V for the electrode 14 and −950 V for the electrode 15.

As can be seen in the trajectories of electron shown in FIG. 5 (1) and FIG. 6 (1) and the graphs shown in FIG. 5 (3) and FIG. 6 (3), the beams widen than being collimated as the energy of the electron becomes bigger, and the beams converge than being collimated as the energy of the electrons becomes smaller.

Figure 7:
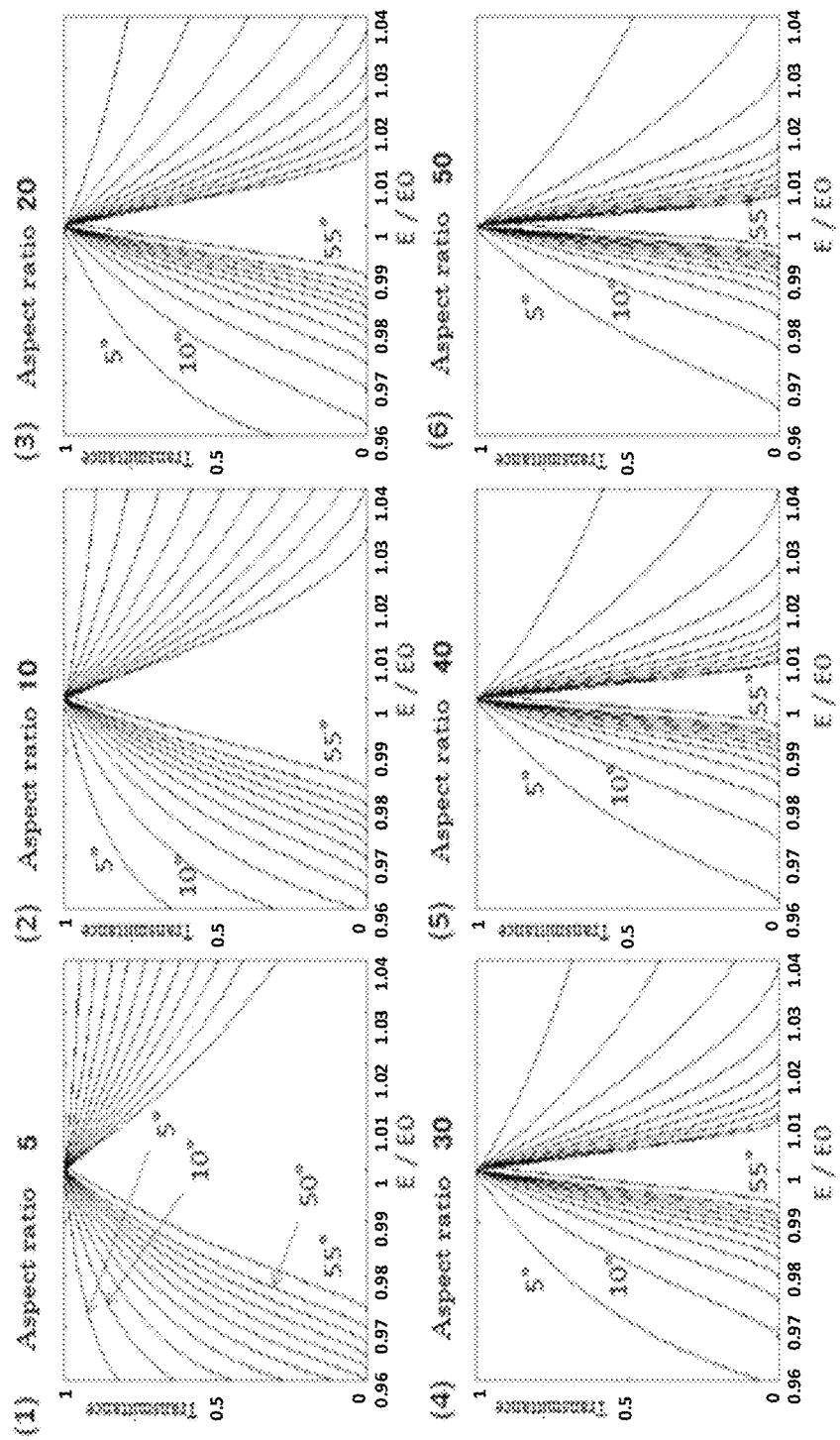
FIG. 7 shows a transmittance of a planar collimator plate.

The transmittance of the planar collimator plate is explained referencing FIG. 7. FIG. 7 shows the transmittance (in the case of a point source) of a planar collimator plate having the aspect ratio (the ratio of bore diameter to bore length) of 1:5. Also, FIG. 7 (2)~(6) represent transmittance (in the case of a point source) of the planar collimator plate furnished with pores having aspect ratios (ratio of pore diameter to pore length) of 1:10, 1:20, 1:30, 1:40 and 1:50. It shows that the enough band-pass filter function can be obtained only with the planar collimator plate, because the transmittance for other than specific energy is suppressed especially when the emission angle (deviation angle) becomes larger.

Figure 8:
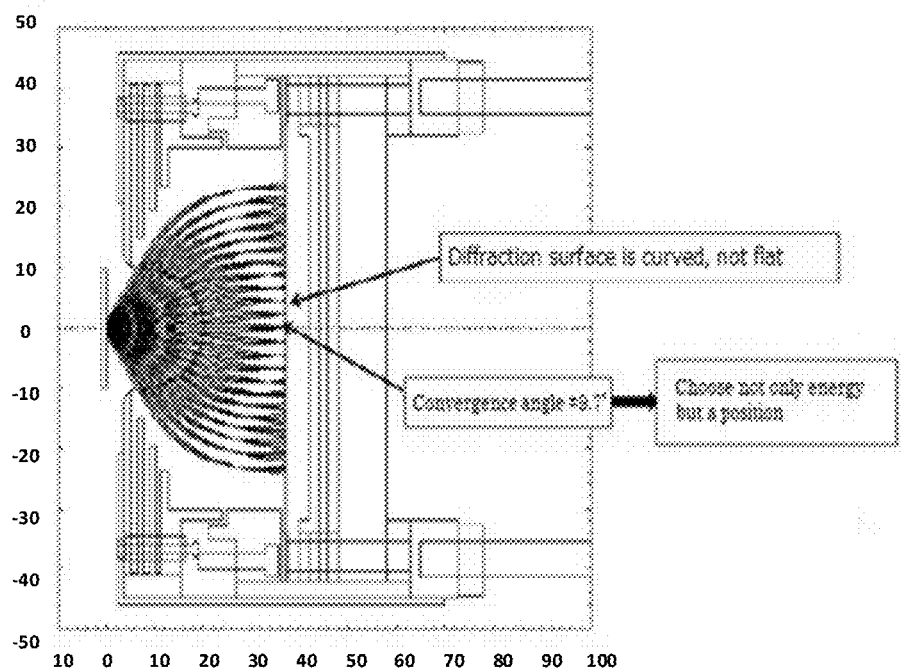
FIG. 8 shows an explanation diagram of a trajectory of an electron when the position of the electron emission is changed.

FIG. 8 shows the trajectory of the electron when the position of the electron emission is changed (±0.5 mm, ±1.0 mm assuming the position of the point source being 0) by expanding the range for irradiation of excitation beam on the sample surface when the placement and the potential of the electrode for 1000 eV electron energy are same, in the parallel beam generation apparatus shown in FIG. 1. In this case, the diffraction plane of the electron incident on the planar collimator plate becomes a curved surface, not a flat surface. The convergent angle of the electron beam on the axis becomes ±9.7° and it is known that not only the energy but also the position is selected. The parallel beam generation apparatus according to this embodiment achieve the energy resolution of 1.0~0.5% is achieved in the case wherein the excitation beam of 100 μm or less convergent is used as a convergence beam. Conversely, for the electron diffraction wherein elastic scattering component is dominant, it is possible to selectively measure the electron diffraction pattern in the region of 100 μm or less even if the diameter is large.

Embodiment 2

Figure 9:
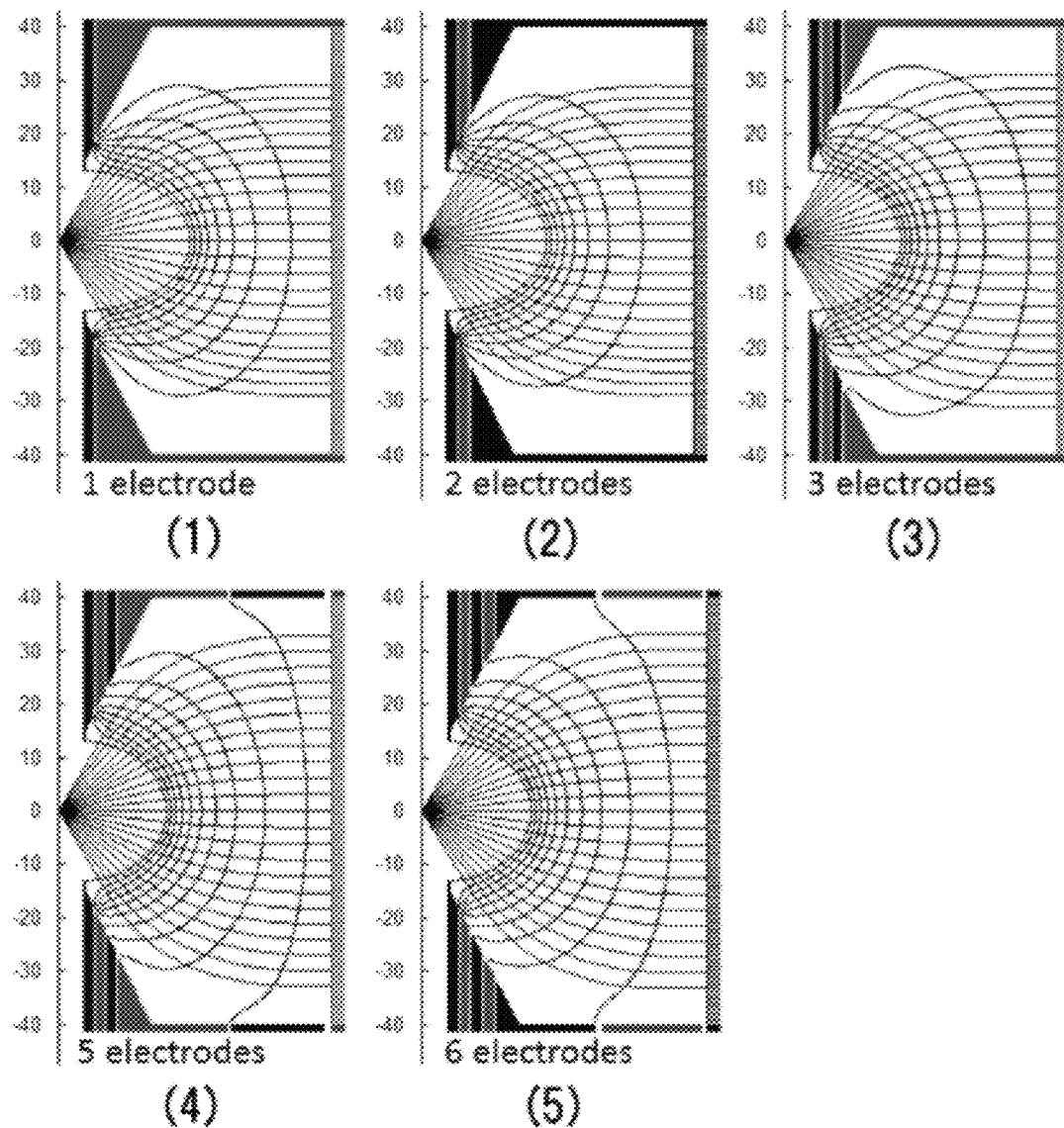
FIG. 9 shows an explanation diagram of differences in a number of electrodes of electrostatic lens.

Next, a case wherein the number of electrodes of the electrostatic lens is different in the parallel beam generation apparatus of the embodiment 1 is explained referencing FIG. 9.

FIGS. 9 (1)~(5) show the trajectory of electrons emitted from a point source by the incident light with the incident angle of 75° by the electrostatic lens using an aspheric lens having the same shape. The incident light of the incident angle of 75° is intended not to interfere with the trajectory of the outgoing electrons. FIG. 9 (1)~(5) respectively has different number of electrodes. The mesh electrode connected to aspheric mesh is fixed to the earth electric potential and single electrode or a plural number of electrodes is arranged with a minus electric potential. Namely, the electrodes other than the mesh electrode are at the minus potential. FIG. 9 (1) shows the number of electrode being 1, FIG. 9 (2) shows the number of electrode being 2, FIG. 9 (3) shows the number of electrode being 3, FIG. 9 (4) shows the number of electrode being 5 and FIG. 9 (5) shows the number of electrode being 6. Note that the mesh electrode fixed to the earth potential is eliminated from counting.

As a result of the simulation, it is known that more than 5 electrodes as shown in FIG. 9 (4) or FIG. 9 (5) are necessary to securely collimate from the point source to emission angle of 60° or nearby, more than 5 electrodes as shown in FIG. 9 (4) or FIG. 9 (5) are necessary. However, in a general-purpose application, it was confirmed that even a single electrode in FIG. 9 (1) could be substantially collimated and it could sufficiently put into practical use.

Next, in the parallel beam generation apparatus, optimization of the shape of the aspheric mesh was conducted according to embodiments with different number of electrodes.

As the number of electrodes increases, the ratio of the major axis to the minor axis becomes smaller and the shape becomes nearer to a sphere. By introducing a shape extending inwardly along the curvature of convex at vicinity of the mesh opening portion, it becomes possible to securely collimate from the point source to the vicinity of emitting angle 60°.

Embodiment 3

An ion etching apparatus in which a parallel beam generating apparatus shown in FIG. 1 is incorporated as a single-energy large-diameter parallel-ion-beam source is explained.

Ion etching apparatus is used for semiconductor micro device manufacturing, tools cutting, removal of coating on electric and electronic devices, removal of micro size burr, advanced profiling, removal of smear adhered at the metal material surface and activation of metal surface, and an ion beam emitted from an ion beam source is chemically reacted with atoms at the etching surface, or material surface for etching is scraped by a physical chemistry method, thus etches the shape of the material surface.

As described above, a large-diameter parallel ion beam of single kinetic energy can be generated after taking in ions in a large solid angle range by using the parallel beam generation apparatus in Embodiment 1 or Embodiment 2. Namely, it becomes possible to make the ion beam source of the ion etching apparatus the large-diameter parallel-ion-beam source by using the parallel beam generation apparatus in Embodiment 1 or Embodiment 2. Resultantly, a precise shape control etching becomes possible by achieving molding of high aspect ratio without processing sag at edges even in the pattern processing using masks because an ion beam irradiates the sample surface vertically even in places far away from the ion beam center. Also, it becomes possible to control the thickness of the thin film to be etched because controlling of the etching speed becomes easier when an ion of single energy is employed.

Embodiment 4

Figure 10:
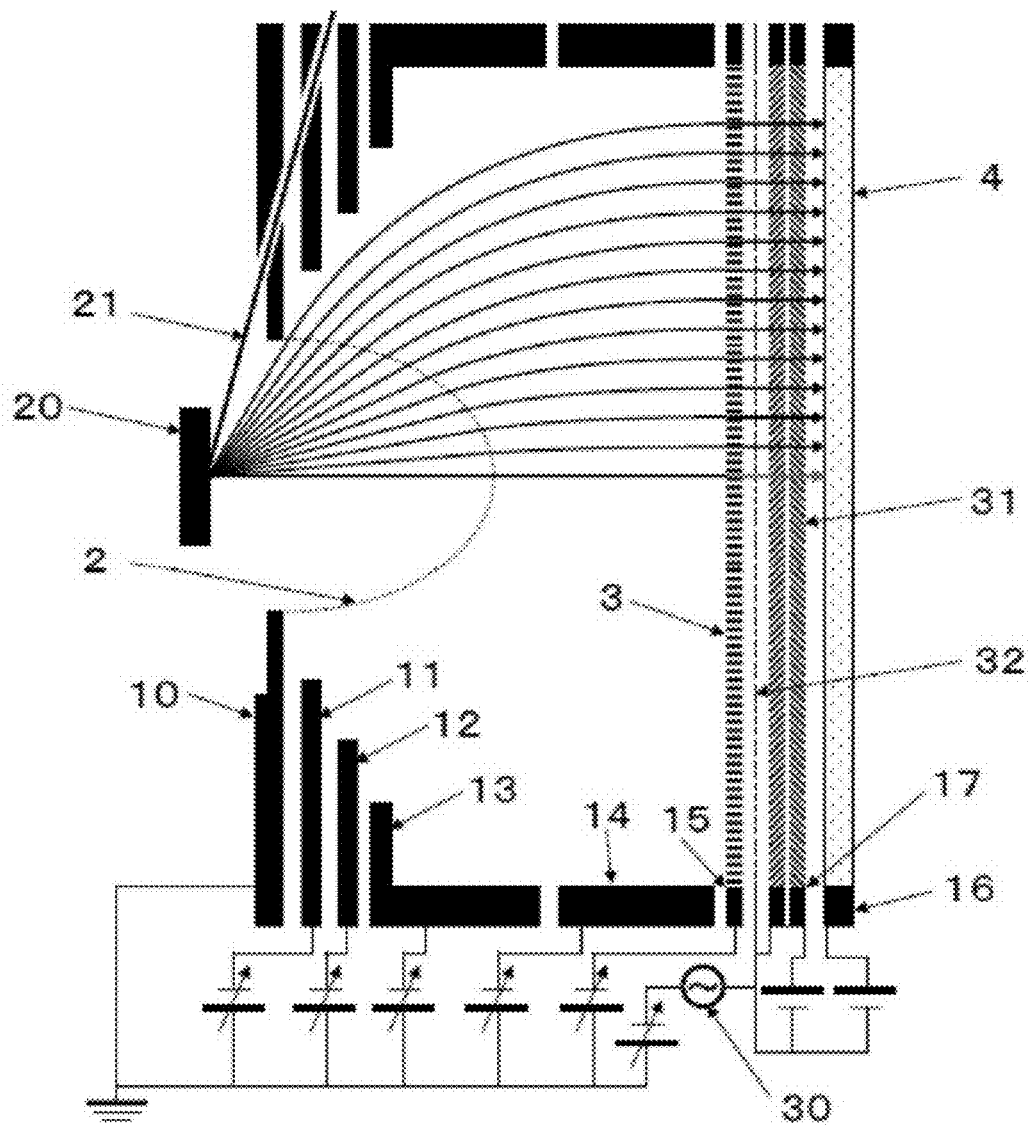
FIG. 10 shows a configuration diagram of an angle distribution measurement and analysis apparatus in Embodiment 4.

FIG. 10 shows a block diagram of an angle distribution measurement and analysis apparatus. The angle distribution measurement and analysis apparatus according to this embodiment, in the parallel beam generation apparatus in Embodiment 1, a retarding-voltage plane grid 32 and a planar microchannel plate 31 are positioned between the planar collimator plate 3 and the fluorescent screen 4 and the current change by the charged particles that passes through the grid 32 is detected by the lock-in modulation electric field 30. By performing the lock-in detection, the energy resolution ($\Delta E/E$) of the charged particle of a specific kinetic energy emitted from the planar collimator plate 3 can be improved to 0.1~0.01%.

In the conventional blocking electric field type apparatus, the S/B ratio (Signal/Background ratio) is poor and the amplification by the planar microchannel plate is difficult. For the lock-in detection, in contrast to the fact that the electric-field modulation of 1 V to 10 V is employed, the angle distribution measurement and analysis apparatus in FIG. 10 is capable to reduce the modulation electric field intensity to 100 mV due to the band-pass function by the planar collimator plate 3, which enables high S/B ratio and high amplification. Also, signal amplification can be conducted by using the planar microchannel plate. Note that the energy resolution of the band-pass filter by the planar collimator plate 3 is a relative value with 1 eV for 100 eV and 10 eV for 1 keV in the case of the energy resolution being 1%. Also, because the measurement energy resolution by the lock-in detection becomes an absolute value, the resolution becomes 0.1% for 100 eV and 0.01% for 1 keV in the case of 100 mV modulation electric field.

Embodiment 5

Figure 11:
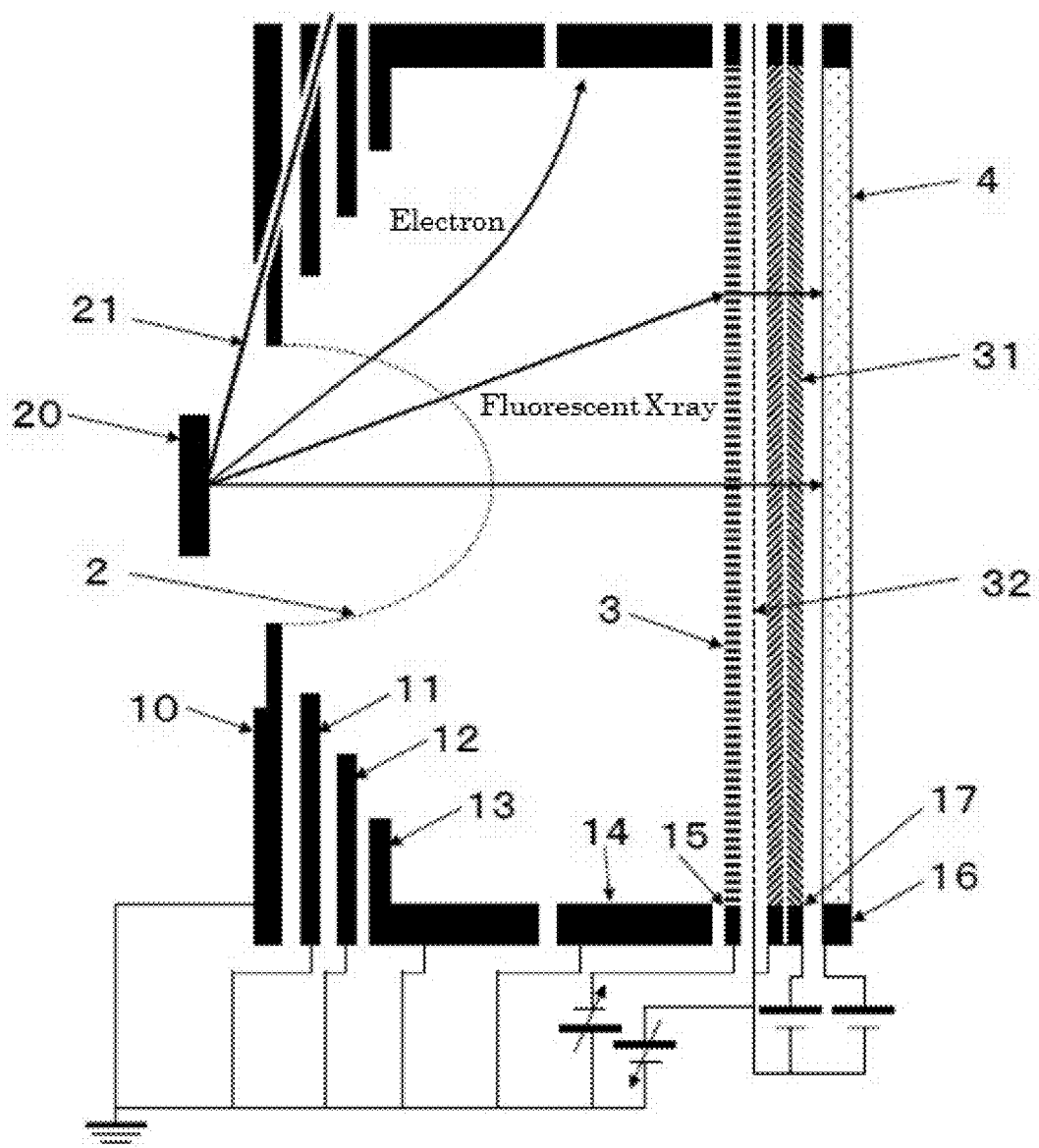
FIG. 11 shows a configuration diagram of a large solid angle X-ray detector in Embodiment 5.

FIG. 11 shows a configuration diagram of the large solid angle X-ray detector. In the large-solid-angle X-ray detector according to the present embodiment, electrons generated at the planar collimator plate 3 are amplified by setting the planar collimator plate 3 at a negative potential and the fluorescent screen 4 at a positive potential, as explained below.

When the core level is excited using X-rays and electrons, valence electrons and so on are decay into the generated core hole, and Auger electrons and fluorescent X-rays are released by gaining that excess energy. Auger electrons having short mean free path is released from the vicinity of the sample surface, and fluorescent X-ray having long mean free path is released also from the inside of the crystal. In the X-ray absorption spectroscopy measurement, Auger electrons and fluorescent X-rays are released in proportion to the X-ray absorption intensity, and Auger electron yield method X-ray absorption measurement and fluorescent X-ray yield method X-ray absorption measurement have been conducted so far using separate detectors. The fluorescent X-rays propagate linearly regardless of an electric field, all the fluorescent X-rays reach the fluorescent screen and cannot be removed in the retarding-voltage-type electron analyzer using the conventional spherical mesh.

In the embodiment 4 described above, fluorescent X-ray can be eliminated at the time of Auger electron analysis by blocking the path of the fluorescent X-ray that travels in a straight line by combining the planar collimator plate 3 and the retarding-voltage plane grid 32. Contrarily, in the embodiment 5, the signal intensity of the fluorescent X-ray can be converted to electron by the planar collimator plate 3, making it possible to be put to use as a large-solid-angle X-ray detector, by applying a plus potential at the retarding-voltage plane grid 32 and the fluorescent screen 4 and preventing Auger electron by applying a negative potential at the planar collimator plate 3.

As have been described above, Auger electrons and fluorescent X-rays can be measured by the same detector only by reversing the electric field direction to be applied according to the present invention, converting to another detector that provides information regarding X-ray absorption information depending on the surface and the bulk deep inside the crystal.

Here, at the time of X-ray detection, a planar microchannel plate 31 is positioned to amplify electrons because it is necessary to amplify after converting the X-ray to electrons by the planar collimator plate 3. On the other hand, the retarding-voltage plane grid 32 which is necessary to conversely bounce back the electrons generated from the X-ray at the time of X-ray elimination. Note that electrodes 11~14 are connected to earth and the electrode 15 is set to a negative potential in the configuration of FIG. 11, however, all the electrodes 11~15 can be set to a negative potential.

Embodiment 6

A parallel beam converging apparatus capable of measuring the intensity of the charged particles by a process of reversing the entrance and the exit of the parallel beam generation apparatus shown in FIG. 1 to extract the charged particle flow in a specific direction by the planar collimator plate 3, only the particles having a specific energy converge to one point by an electrostatic lens to be measured.

The parallel beam converging apparatus, similar to the configuration shown in FIG. 1, consisting of an axisymmetric and aspherical mesh 2 having a concave surface against the focusing spot and an electrostatic lens consisting of a single or a plural number of axisymmetric electrodes and a planar collimator plate 3 positioned coaxially with the electrostatic lens, and the shape of the aspheric mesh 2, the potential and the arrangement of the earth electrode 10 and the electrodes for electric application (11~15) are coordinated so that the trajectory of the charged particle of a specific kinetic energy incident quasi perpendicularly on the planar collimator plate 3, after emission is converged at the converging point by the electrostatic lens.

However, in the parallel beam converging apparatus, the doorway is reversed when compared with the parallel beam generating apparatus. Also, the fluorescent screen 4 and the excitation beam induction pipe 21 are not necessary in the parallel beam converging apparatus compared with the case of the parallel beam generation apparatus.

The potentials of electrodes 10 to 15 are the same as in the embodiment 1, with the electrode 10 being 0 V (fixed to the ground potential), the electrode 11 being −520 V, the electrode 12 being −780 V, the electrode 13 being −888 V, the electrode 14 being −914.5 V and the electrode 15 is −950 V.

Here, the planar collimator plate 3 functions as a band-pass filter that selects only charged particles of specific energy, and extracts a charged particle flow in a specific direction. The planar collimator plate 3 is furnished with pores of the aspect ratio (the ratio of the pore size to the pore length) being 1:10.

The shape of the aspheric mesh is a substantial spheroid whose major axis is from the vicinity of the center of the mesh opening to the mesh center and the vicinity of the mesh opening widens with an inwardly convex curvature.

Embodiment 7

In embodiments 7 and 8, an embodiment of an electrostatic lens is described.

In the electrostatic lens according to the present invention, the optical system comprised of a plural number of electrodes, at least one of which is provided with an aspherical mesh having a concave with respect to the object plane. This aspherical mesh captures charged particles from a point source over a large solid angle and collimates the trajectory of captured charges with high parallelism.

The shape of the aspherical mesh can be designed using the surface of spheroid, in the case where the acceptance angle for charged particles generated at the point source is ±60° and having the deviation angle of the trajectory of the charged particle equal or less than ±1° for parallelization, not necessitating such a high parallelism.

Furthermore, the number of electrodes excepting the mesh electrodes fixed to the ground potential, can be a minimum of 1 in cases where the acceptance angle for parallelizing can be less than around ±50° or such a high parallelism is not needed.

In the following, the shape of the aspheric mesh is designed by a surface of spheroid, and for the electrostatic lens with 1 to 5 electrodes, the trajectory and parallelism of these charged particles will be explained.

Figure 12:
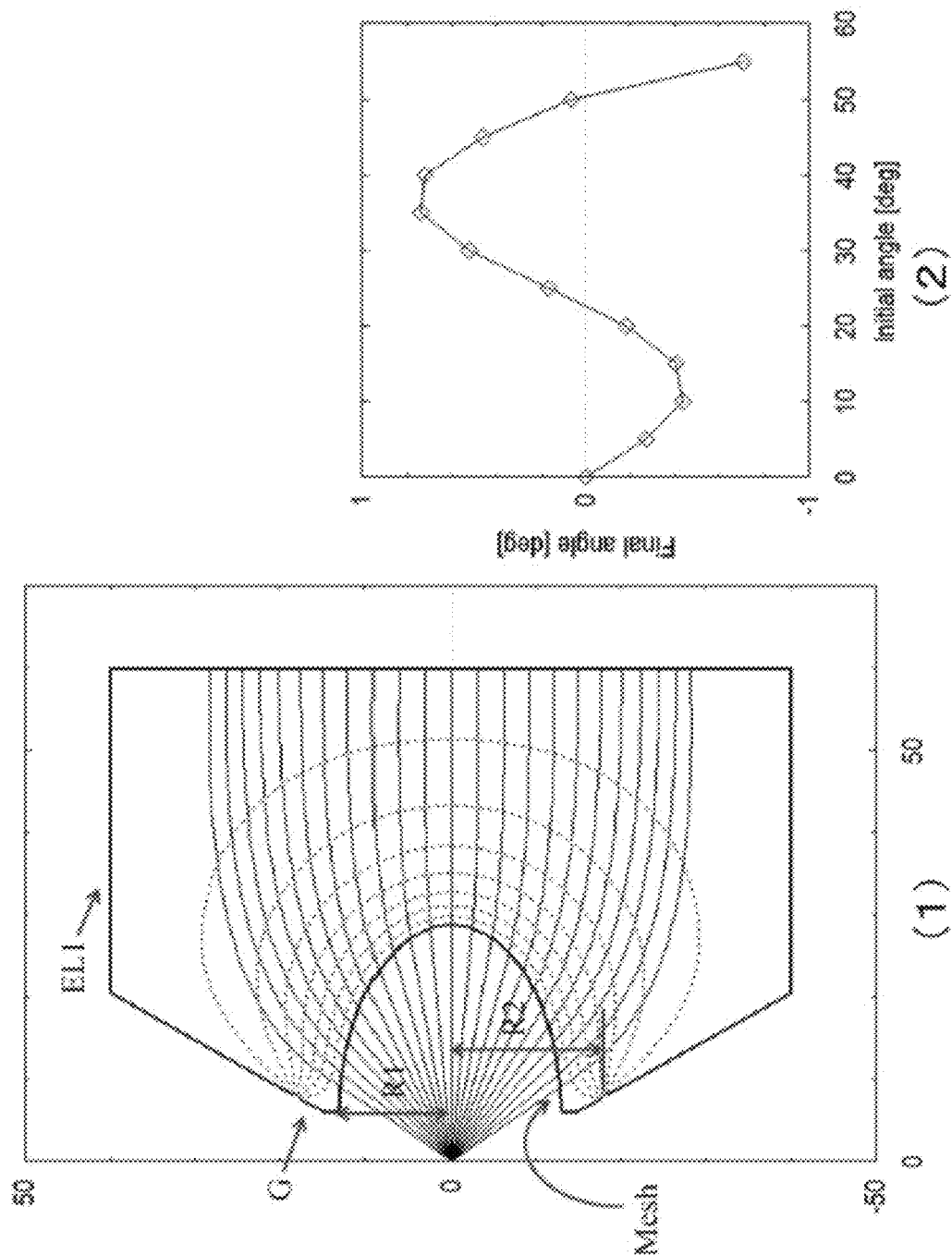
FIG. 12 shows a trajectory and parallelism of charged particle of an electrostatic lens (with 1 electrode) in Embodiment 7.

FIG. 12 shows one example of an electrostatic lens having 1 electrode. The shape of the aspherical mesh is designed by a spheroid and the ratio of the major axis radius to the minor axis radius (hereinafter abbreviated as the major axis to minor axis ratio) in the spheroid is 1.79. The voltage applied to each electrode is, 0 V for the mesh electrode (G) and −775 V for the first electrode (EL1).

FIG. 12 (1) is a sectional view including the analyzer symmetric axis, and the thick solid line shows the electrode and the inner shape of the aspherical mesh. The dotted line represents the equipotential line, and the thin solid line represents the trajectory of the charged particle. The incident angle is drawn from −55° to 55° with 5° steps.

A mesh of spheroid shape is connected to the mesh electrode (G). The major axis to minor axis ratio of the spheroid is set at 1.79. The termination of the first electrode (EL1) corresponds to the planar collimator. The voltages applied to the mesh electrode (G) and the first electrode (EL1), respectively are 0 V and −775 V, against an electron of 1 KeV.

FIG. 12 (2) is a graph showing the angle (angle from the analyzer symmetric axis) at the end of the charged particle trajectory shown in FIG. 12 (1) plotted against the initial angle (Initial Angle) to the aspheric mesh. It can be seen that the charged particles of −55° to 55° are collimated to an angle of about 0.8° against the analyzer symmetric axis.

For collimation, the way to position the electrodes in addition to the shape of the mesh is important. In particular, the positional relationship between the mesh electrode (G) and the first electrode (EL1) becomes important. According to the calculations, assuming that the opening radiuses of the mesh electrode (G) and the first electrode (E1) are R1 and R2 (Refer to FIG. 12 (1)), the ratio of R2/R1 being from 1.2~1.6 is a preferable state. For the electrostatic lens shown in FIG. 12, it is known that R2/R1=1.42. The electrostatic lens in FIGS. 13-18 to be described later each results in R2/R1=1.42.

Figure 13:
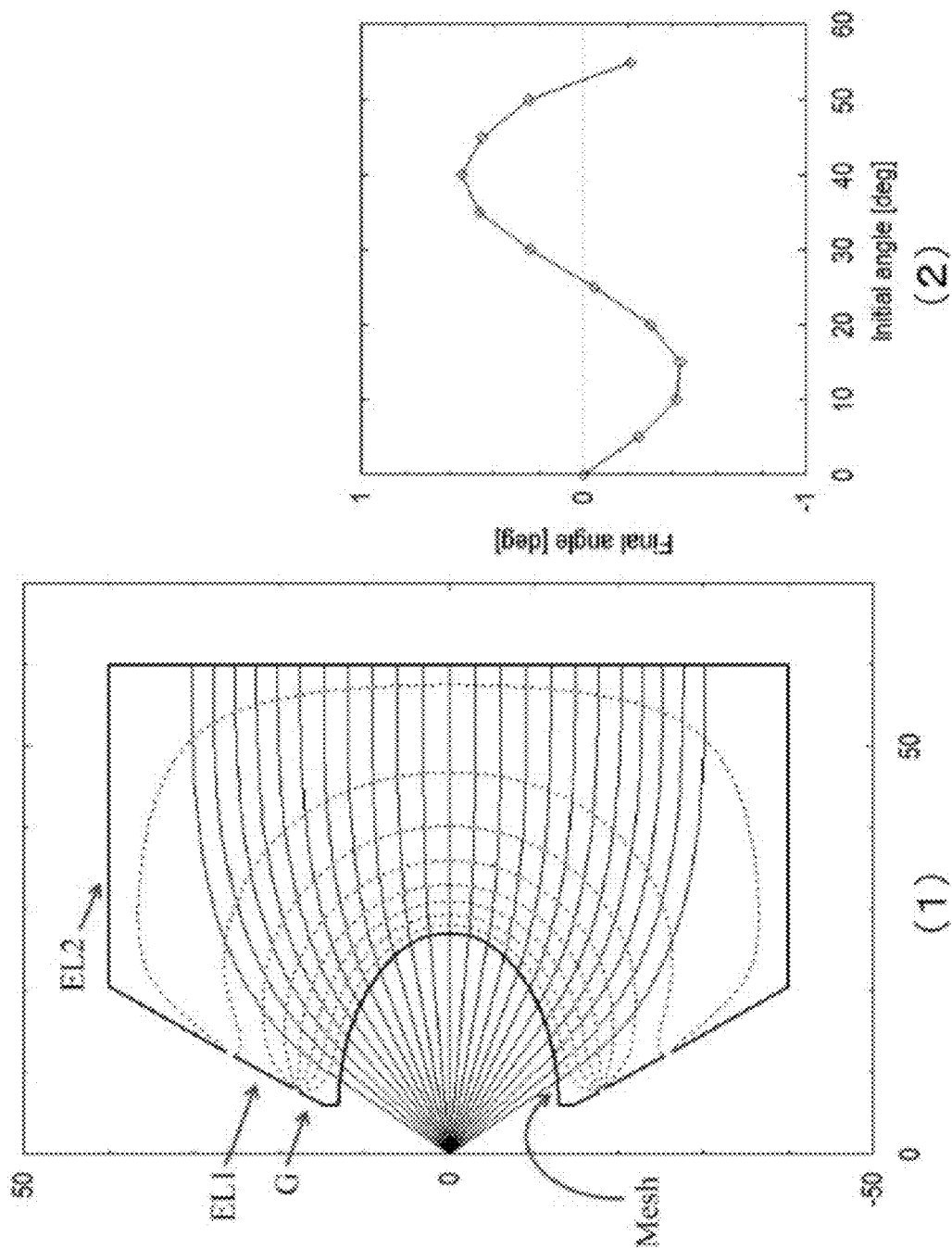
FIG. 13 shows a trajectory and parallelism of charged particle of an electrostatic lens (with 2 electrodes) in Embodiment 7.

FIG. 13 shows an example of an electrostatic lens having two electrodes. The shape of the aspherical mesh is designed by a spheroid, and the major axis to minor axis ratio is 1.66. The voltage applied to each electrode is 0 V for the mesh electrode (G), −680 V for the first electrode (E1) and −820 V for the second electrode (E2) for electrons at 1 keV.

The electrostatic lens shown in FIG. 13 (1) having 2 electrodes is obtained by dividing the first electrode (EL1) in FIGS. 12 (1) to 2 on the side of the mesh electrode (G). Comparing FIG. 13 (1) and FIG. 12(1) regarding the trajectory of the charged particles, the trajectory spacing becomes considerably narrower at the large angle side as a result of collimation as shown n FIG. 12(1), in contrast, the trajectory spacing are almost equally spaced in FIG. 13(1) as a result of collimation.

Also, FIG. 13 (2) is obtained by plotting the angle (the angle from the analyzer symmetric axis) at the end point of the trajectory shown in FIG. 13 (1) against the incident angle, and it is known that the angle formed by the charged particles with the incident angle being −55° ~55° is collimated to as low as 0.6°.

Figure 14:
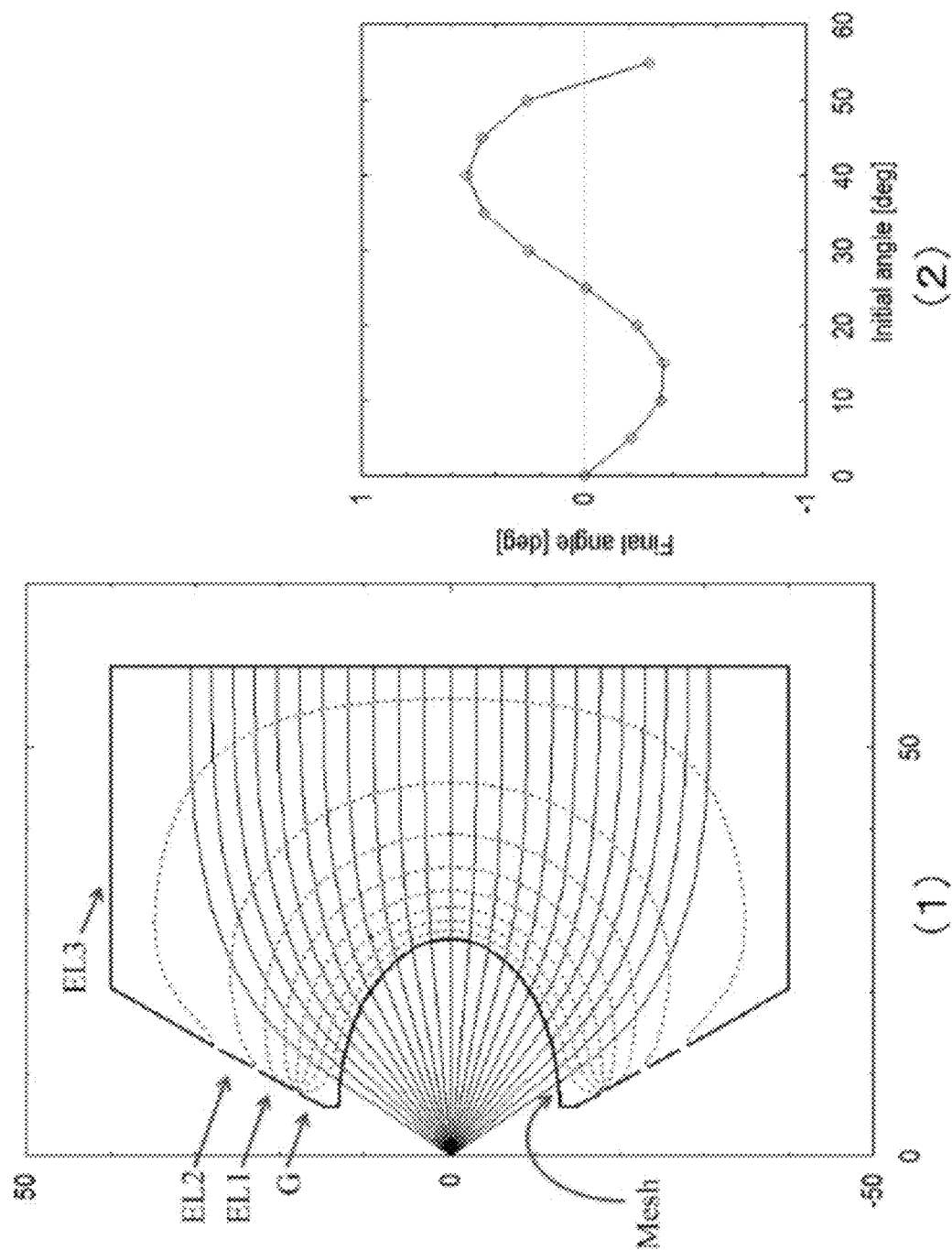
FIG. 14 shows a trajectory and parallelism of charged particle of an electrostatic lens (with 3 electrodes) in Embodiment 7.

FIG. 14 shows an example of an electrostatic lens having 3 electrodes. The shape of the aspheric mesh is designed by a spheroid, and the major axis to minor axis ratio in the spheroid is 1.62. The voltage applied to each electrode is 0 V for the mesh electrode (G), −6.25 V for the first electrode, (EL 1), −7.45 V for the second electrode (EL 2), −832 V for the third electrode (EL 3) for electrons at 1 keV.

The electrostatic lens having 3 electrodes shown in FIG. 14 (1) is obtained by dividing the first electrode (EL 1) in FIG. 12 (1) into three on the side of the mesh electrode (G). Comparing FIG. 14 (1) with FIG. 12 (1) with regard to the trajectory of charged particles, in FIG. 12 (1), the trajectory spacing is becoming considerably narrow at the larger angle region as a result of collimation, while in FIG. 14 (1), the trajectory spacing is becoming substantially equal as a result collimation.

Also, in FIG. 14 (2), the angle at the end point of the trajectory (the angle from the analyzer symmetric axis) shown in FIG. 14 (1) is plotted against the incident angle, and it is known that the angle formed by the charged particles of the incident angle of −55° ~55° with the analyzer symmetric axis is collimated to as low as 0.6°.

As has been explained, in the cases of the electrostatic lens with 2 electrodes (FIG. 13) and the electrostatic lens with electrodes (FIG. 14), compared with the case of the electrostatic lens with 1 electrode (FIG. 12), the parallelism of the trajectory of the charged particles is found to have been improved.

When an attention is paid to the shape of the aspheric mesh, it is known that the proper aspheric mesh shape changes to spheroid having smaller major axis to minor axis ratio by changing the number of electrodes. In the examples of FIG. 13 (1) and FIG. 14 (1), the major axis to minor axis ratio of the spheroid is 1.66 and 1.62, respectively. Generally, the transmittance becomes higher as the incident angle becomes nearer to perpendicularity. Accordingly, mesh having smaller major axis to minor axis ratio has advantage in realizing higher transmittance. Also, smaller major axis to minor axis ratio is desirable in producing mesh electrodes with high precision.

Figure 15:
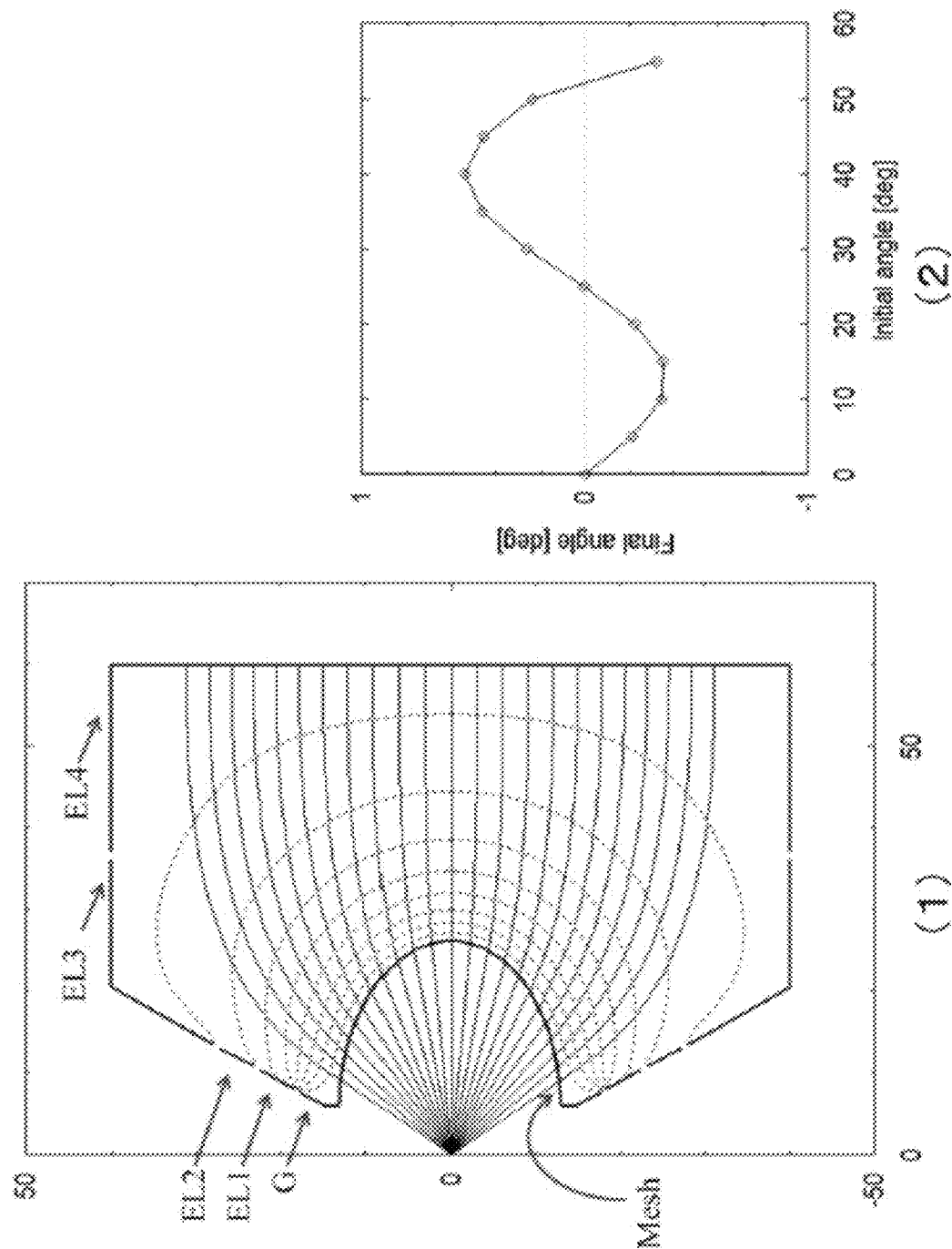
FIG. 15 shows a trajectory and parallelism of charged particle of an electrostatic lens (with 4 electrodes) in Embodiment 7.

FIG. 15 shows one example of an electrostatic lens of the number of electrode being 4. The shape of the aspheric mesh is designed by a spheroid and the major axis to minor axis ratio of the spheroid is 1.59. The voltage applied to each electrode is 0 V for the mesh electrode (G), −620 V for the first electrode (EL 1), −750 V for the second electrode (EL 2), −830 V for the third electrode (EL 3) and −850 V for the fourth electrode (EL 4).

The electrostatic lens having 4 electrodes in FIG. 15 (1) is obtained by dividing the third electrode (EL 3) in FIG. 14 (1) into two portions by a cylindrical portion.

Figure 16:
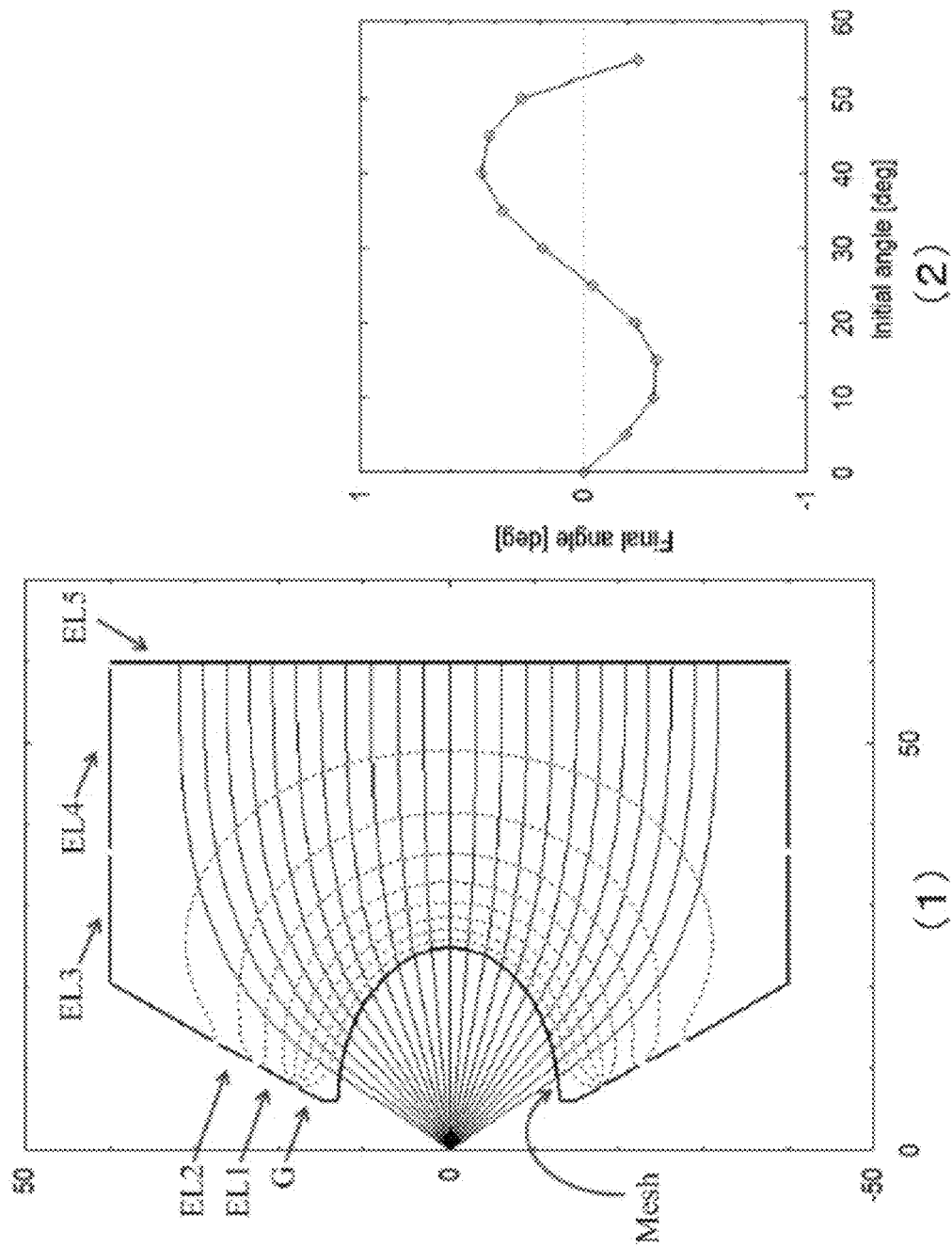
FIG. 16 shows a trajectory and parallelism (1) of charged particle of an electrostatic lens (with 5 electrodes) in Embodiment 7.

FIG. 16 shows one example of an electrostatic lens having five electrodes. The shape of the aspherical mesh is designed by a spheroid and the major axis to minor axis ratio in the spheroid is 1.49. The voltage applied to each electrode is 0 V for the mesh electrode (G), −590 V for the first electrode (EL 1), −730 V for the second electrode (EL 2), −860 V for the third electrode (EL 3), −880 V for the fourth electrode (EL 4) and −900 V for the fifth electrode (EL 5).

In the electrostatic lens having 5 electrodes as shown in FIG. 16 (1), the third electrode (EL 3) as shown in FIG. 14 (1) is divided into 2 and further, the end portion is separated from the cylindrical portion, which is made to the fifth electrode (EL 5).

Figure 17:
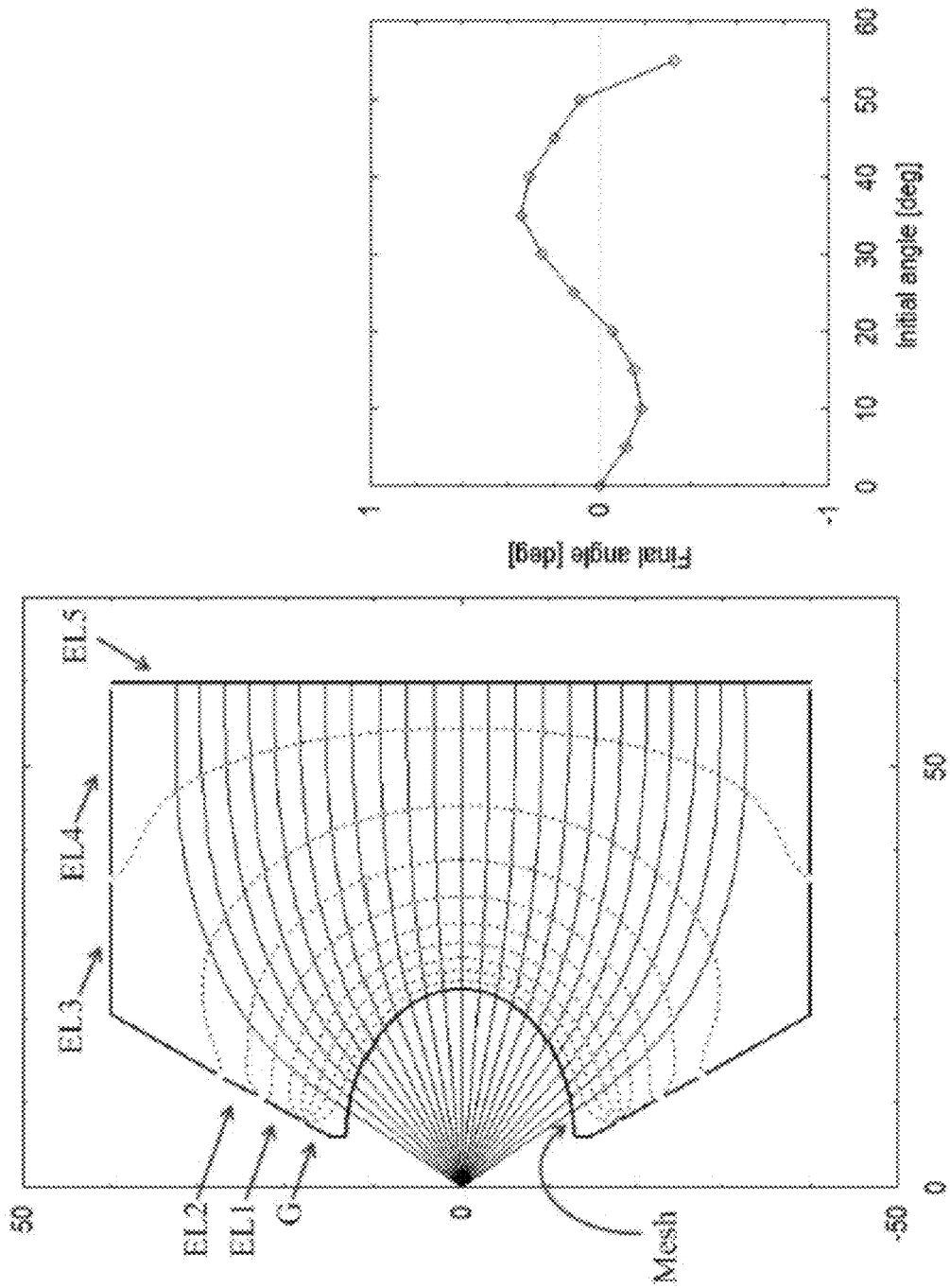
FIG. 17 shows a trajectory and parallelism (2) of charged particle of an electrostatic lens (with 5 electrodes) in Embodiment 7.

FIG. 17 is one example of an electrostatic lens having 6 electrodes as in FIG. 16. However, the shape of the aspheric mesh is designed by a spheroid with the major axis to minor axis ratio in the spheroid being 1.37. Also, the applied voltage for each electrode is 0 V for the mesh electrode (G), −580 V for the first electrode (EL 1), −730 V for the second electrode (EL 2), −870 V for the third electrode (EL 3), −919 V for the fourth electrode (EL 4) and −950 V for the fifth electrode (EL 5), against the electron of 1 keV.

In electrostatic lenses in FIG. 16 and FIG. 17, the number of electrodes is the same, but the rate of deceleration is different. Here, the ratio (Ef/Ej) of the kinetic energy at the terminal energy (Ef) at the terminal end portion to the kinetic energy (Ej) at the time of incidence is defined as the reduction ratio.

The reduction ratios in FIGS. 15 to 17 are 0.15, 0.1 and 0.05, respectively. In order to achieve a low reduction ratio, it is preferable that the cylindrical portion is not configured with a single electrode, but is configured with a plural number of electrodes as shown in FIGS. 15 to 17. In FIGS. 15 to 17, the major axis to minor axis ratios of the ellipsoid of revolution are 1.59, 1.49 and 1.37, respectively. It can be seen that as the reduction ratio decreases, the shape of an appropriate mesh becomes a spherical surface with a smaller major axis to minor axis ratio.

In FIGS. 12 to 17, the angle formed by the trajectory of the charged particles obtained with the analyzer symmetric axis is about 0.3° to 0.8°, but this parallelism can be remarkably improved by the aspherical mesh shape being expressed by an appropriate polynomial function, not by a spheroid. This will be explained in the following Embodiment 8.

Embodiment 8

Next, in the electrostatic lens according to the present invention, the mesh shape is not designed by the spherical surface but by an aspherical surface mesh having a shape different from the spherical surface is used, in a case where the acceptance angle for the charged particles generated at the point source is ±60°, and the trajectory of the charged particles is parallelized with the deviation angle from the analyzer symmetric axis being ±1° or less, and further when higher parallelism is needed in comparison with the electrostatic lens shown in Embodiment 7 described above.

More specifically, the shape of the aspherical mesh is designed with the radius direction deviation from the major axis being 5% or less and also, an inflection point exists in the plot of first-order angle differentiation of the deviation in the radius direction described above, at the position where the angle formed by the axis connecting the point source and the mesh-shaped surface and the major axis being larger than 40°.

Specifically, the aspherical mesh shape can be represented by $d_{mesh}$ expressed by the following polynomial function equation.

[Equation 2]

$$d_{mesh} = d_2 + (d_1 - d_2)\sum_{i=1}^{n}(a_i/w)\cos^{(i)}\alpha \quad (1)$$

$$\left(\alpha = \frac{\pi}{2}\theta/\theta_{max},\ w = a_1 + a_2 + \ldots + a_n\right)$$

Figure 19:
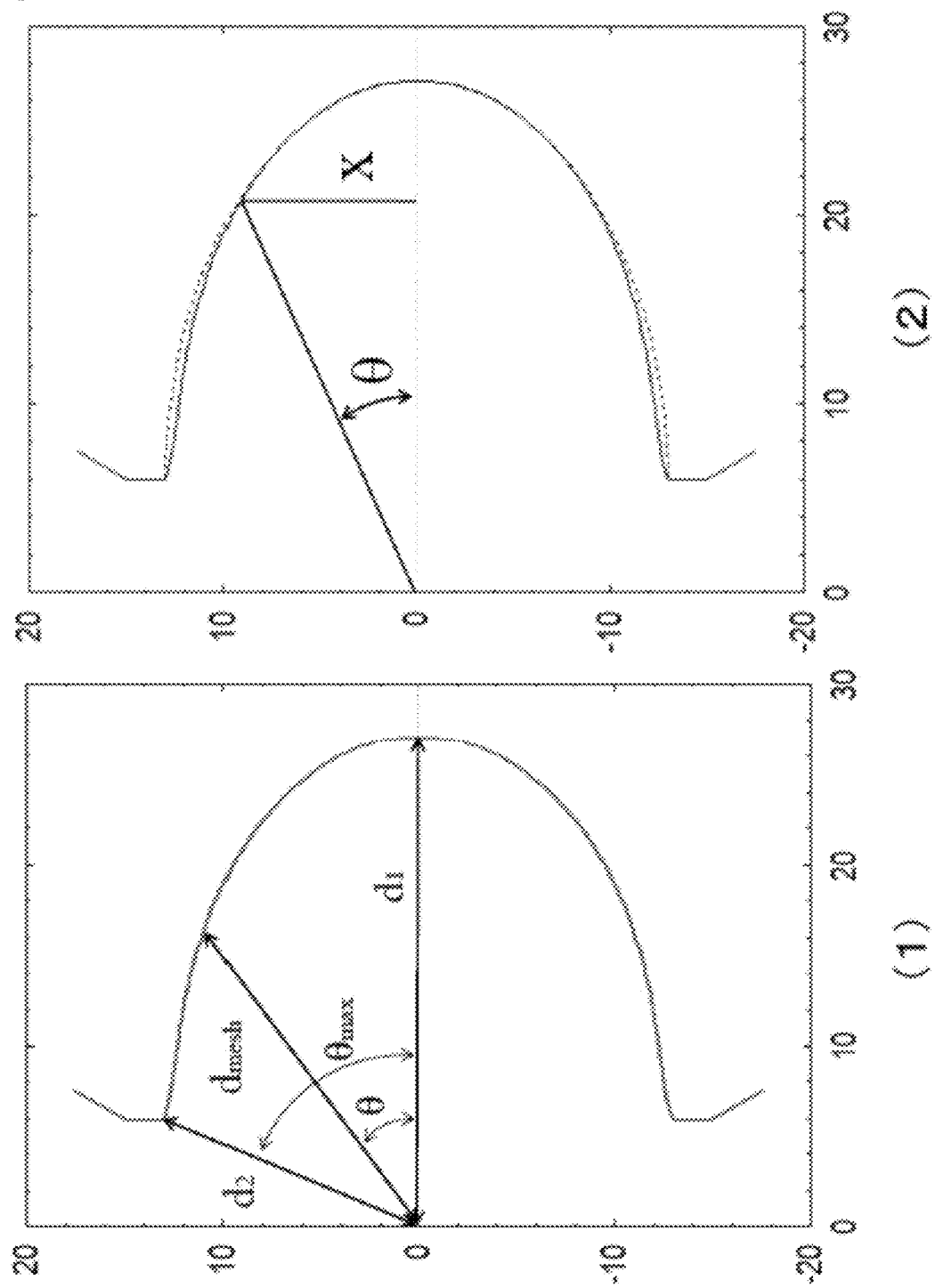
FIG. 19 shows an explanation diagram of an aspherical mesh shape of an electrostatic lens (with 2 electrodes) in Embodiment 8.

In the equation of the polynomial function above, as shown in FIG. 19 (1), $d_{mesh}$ is the distance from the point source to the mesh surface position, the distance $d_1$ is the distance from the point source to the mesh tip position and the distance $d_z$ is the distance from the point source to the edge position. Also, the angle θ and $θ_{max}$ represents the mesh surface and deviation angle from the analyzer symmetric axis for determining the edge position of the mesh, respectively. Also, α is a function of the angle θ, n is the dimensionality of the function and w is a parameter determined by the parameters $a_1 \sim a_n$.

Figure 18:
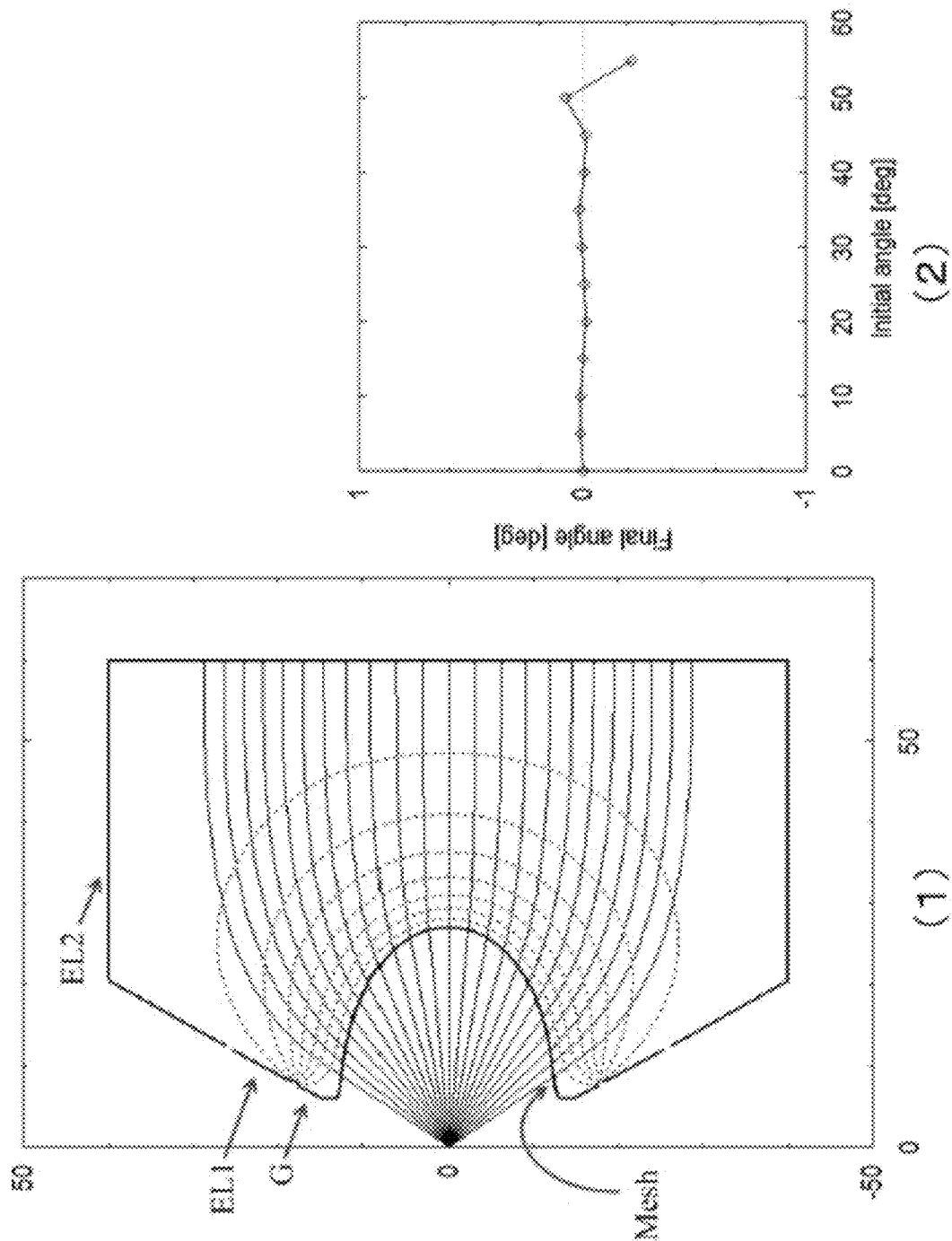
FIG. 18 shows a trajectory and parallelism of charged particle of an electrostatic lens (with 2 electrodes) in Embodiment 8.

FIG. 18 is one example of an electrostatic lens in which the shape of the aspherical mesh is designed using the above polynomial function. As shown in FIG. 18 (1), the configuration of the electrode in the electrostatic lens of this embodiment is the same as the configuration of electrode in the electrostatic lens with the number of electrode being 2, as shown in FIG. 13, and the applied voltage of each electrode is 0 V for the mesh electrode (G), −772 V for the first electrode (EL1) and −796 V for the second electrode against the electron of 1 keV.

The dimension n of the polynomial function is 5, and the value of each parameter is as shown in Table 1 below.

TABLE 1

| Parameter | Value |
| --- | --- |
| d1 | 27.1 (mm) |
| d2 | 14.3 (mm) |
| θ max | 65.2 (°) |
| a1 | 0.012 |
| a2 | 0.365 |
| a3 | 0.38 |
| a4 | 0.307 |
| a5 | −0.008 |

In FIG. 18 (2), the angle (the angle from the analyzer symmetric axis) at the end point of the trajectory shown in FIG. 18 (1) is plotted with respect to the incident angle. In the case of the electrostatic lens with the number of electrodes being 3, as shown in FIG. 13 (2), the angle formed by the trajectory of charged particles and the analyzer symmetric axis corresponds to about 0.5° parallelism, on the other hands, the angle formed by the trajectory of charged particles and the analyzer symmetric axis corresponds to ±0.01° parallelism, which is a very high parallelism over the acceptance angle of the incident angle of −45°~45°.

FIG. 19 (2) is a comparison between an aspherical mesh shape shown in FIG. 18 and an aspherical mesh shape (spheroid surface) shown in FIG. 12. The former is represented by a solid line and the latter is shown by a dotted line. When the shapes of the both are compared in the term of the distance x in the radial direction, the deviation is about 5% or less. However, there is a decisive difference between the shapes of the both. To more clearly illustrate this difference, the result calculating the first derivative with respect to the angle θ of x for each shape is shown in FIG. 20.

Figure 20:
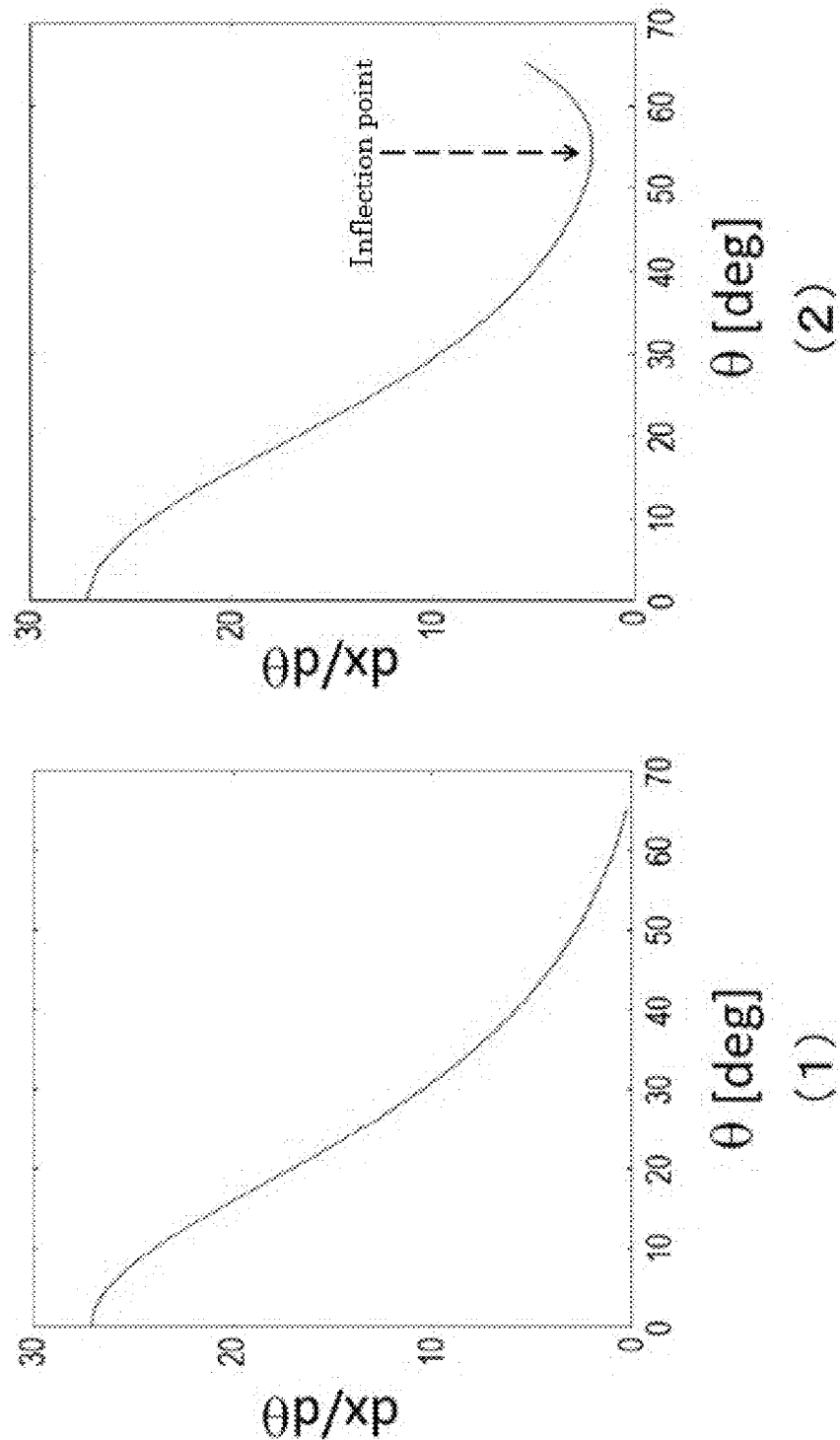
FIG. 20 shows a feature explanation diagram of an aspherical mesh shape of an electrostatic lens (with 2 electrodes) in Embodiment 8.
Figure 21:
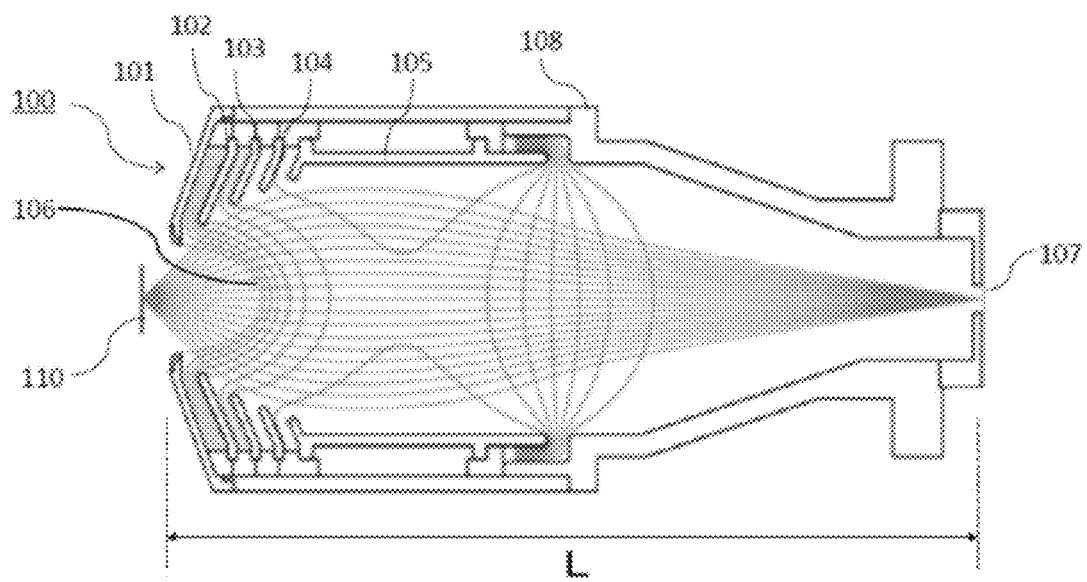
FIG. 21 shows a configuration diagram of a spherical aberration correction electrostatic in the art.

FIG. 20 is a figure for explaining features of the aspherical mesh shape of the electrostatic lens of this embodiment. FIG. 20 (1) corresponds to the aspherical mesh shape (the dotted line in FIG. 19) shown in FIG. 12 and FIG. 20 (2) corresponds to the aspherical mesh shape (the solid line in FIG. 19) shown in FIG. 18, respectively. In the case of the spheroidal surface of the aspherical mesh shape shown in FIG. 12, a monotonous decreasing function without an inflection point can be seen shown in FIG. 20 (1). On the other hand, in the case of aspherical mesh shown in FIG. 18, an inflection point exists and the function decreases along with the increase of θ and then changes itself to an increase shown in FIG. 20 (2). In the aspherical mesh shape shown in FIG. 18, the inflection point exists near the position where θ=54°.

From the above, in electrostatic lenses in Embodiment 7 and 8, it was confirmed that the more adequate mesh shape is a smooth curve having an inflection point on the higher angle side with a discrepancy of less than about 5% in various designs with different a number of electrodes, acceptance angles and reduction ratios. Note, however, that the position of the inflection point and the discrepancy from the spheroid changes depending on the number of electrodes, the major axis minor axis ratio, or a design of parameters polynomial function. The main points of designing of electrostatic lenses in embodiments 7 and 8 are summarized as follows.

(1) In a case where the acceptance angle can be around or less than ±50°, or a parallelism required in not so high, more specifically in a case where the parallelism can be about ±0.5°, the shape of the aspherical mesh can be a spheroid.

(2) The ratio (R2/R1) of the opening radius R1 of the mesh electrode connected to the aspherical mesh and fixed to the ground potential to the opening radius R2 of the first electrode adjacent to the mesh electrode is preferably equal to or more than 1.2 and equal to or less than 1.6.

(3) The number of electrodes excluding the mesh electrode (hereinafter the same) is 1 and the reduction ratio is equal to or more than 0.1 and equal to or less than 0.3, the major axis to minor axis ratio of the spheroid is preferably equal to or more than 1.69 or equal to or less than 1.89.

(4) When the number of electrodes is 2 and the reduction ratio is equal to or more than 0.1 and equal to or less than 0.3, the major axis to short axis ratio of the spheroid is preferably equal to or more than 1.56 and equal to or less than 1.76.

(5) When the number of electrodes is 3 and the reduction ratio is equal to or more than 0.1 and equal to or less than 0.3, the major axis to short axis ratio of the spheroid is preferably equal to or more than 1.52 and equal to or less than 1.72.

(6) When the number of electrodes is 4 and the reduction ratio is equal to or more than 0.1 and equal to or less than 0.3, the major axis to short axis ratio of the spheroid is preferably equal to or more than 1.49 and equal to or less than 1.69.

(7) When the number of electrodes is 5 and the reduction ratio is equal to or more than 0.1 and less than 0.3, the major axis to short axis ratio of the spheroid is preferably equal to or more than 1.39 and equal to or less than 1.59.

(8) Regardless the number of electrodes, when reduction ratio is equal to or more than 0.01 and less than 0.1, the major axis to minor axis of the spheroid is preferably more than 1.0 and less than 1.5.

(9) When a higher parallelism, concretely a parallelism of ±0.3° or less is required, the aspherical mesh shape is not a spheroid but is preferably designed by a smooth curve having an inflection point on the higher angle side with a deviation from that of the spheroid is about 5% or less.

INDUSTRIAL APPLICABILITY

The electrostatic lens and the parallel beam generating apparatus using the same according to the present invention are useful for a measurement of band dispersion at the crystal surface by the angle-resolved photoelectron spectroscopy, Fermi surface mapping, depth direction composition analysis, atomic structure analysis by electron diffraction and photoelectron diffraction, adsorbed molecular structure analysis by angle distribution of ion emission.

Also, the parallel beam focusing apparatus according to the present invention is useful for a charge particle flow direction and energy measurement which measures the energy intensity of a specific energy particle after focusing to one point by an electrostatic lens.

DESCRIPTION OF SYMBOLS

1. Parallel beam generating apparatus
2. Aspherical mesh
3. Planar collimator plate
4. Fluorescent screen
5. Axis
6. Trajectory
7. Point source
8. Magnetic shielding cover
10-17. Electrode
20. Sample surface
21. Excitation beam guide
30. Lock-in modulation electric field
31. Planar microchannel plate
32. Retarding-voltage plane grid

What is claimed is:
1. A parallel beam generation apparatus comprising an electrostatic lens and a planar collimator plate, said electrostatic lens comprising:
   an axisymmetric or substantially axisymmetric aspherical mesh, said mesh being concavely shaped with respect to a point source or a focusing spot; and
   one or more axisymmetric or substantially axisymmetric electrodes;
   wherein said aspherical mesh has a major axis from a vicinity of a center of a mesh opening to a mesh center position or said aspherical mesh has a spheroid shape in which the vicinity of the mesh opening expands inwardly with a convex curvature;
   wherein a mesh electrode connected to said aspherical mesh has an opening with a radius R1, and a first electrode adjacent to the mesh electrode has an opening with a radius R2, and a ratio of R2 to R1 is in the range of 1.2 to 1.6;
   wherein a ratio of the major axis radius to a minor axis radius in said spheroid is in the range of 1.0 to 2.0;

said parallel beam generation apparatus further characterized in that:

said electrostatic lens and said planar collimator plate are positioned coaxially with each other, with an acceptance angle of charged particles generated at a point source being ±60°;

said planar collimator plate is furnished with pores, each pore having an aspect ratio defined as a ratio of pore diameter to pore length, the aspect ratio of 50% or more of said pores being in a range from 1:5 to 1:20;

said planar collimator plate functions as a band-pass filter for selecting only charged particles of a specific kinetic energy;

whereby in operation of the parallel beam generation apparatus a trajectory of charged particles is parallelized with a deviation angle of ±1° or less so that the charged particles incident on the planar collimator plate are approximately perpendicular to said plate.

2. The parallel beam generation apparatus as set forth in claim 1, wherein a reduction ratio is defined as a ratio of kinetic energy at a termination electrode to kinetic energy at a time of charged particle generation, wherein a ratio of a major axis radius to minor axis radius is more than 1.0 and less than 1.5 in said spheroid and said reduction ratio is 0.01 or more and less than 0.1.

3. The parallel beam generation apparatus as set forth in claim 1, further characterized in that:

a discrepancy between the radius of the aspherical mesh major axis and the radius of the aspherical mesh minor axis is 5% or less; and an inflection point in a plot of deviation angle in said radius direction after first-order differentiation thereof is located at a position where an angle formed between an axis connecting a point source with a surface of said aspherical mesh is larger than 40°.

4. The parallel beam generation apparatus as set forth in claim 1, further characterized in that a mesh shape of said substantial spheroid is characterized by $d_{mesh}$, which is expressed by a polynomial function according to a mathematical formula Equation 1 which is defined as follows:

$$d_{mesh} = d_2 + (d_1 - d_2)\sum_{i=1}^{n}(a_i/w)\cos^{(i)}\alpha \qquad (1)$$

$$\left(\alpha = \frac{\pi}{2}\theta/\theta_{max}, w = a_1 + a_2 + ... + a_n\right),$$

$d_{mesh}$ being a distance from the point source to a mesh surface position, distance $d_1$ being a distance from a point source to a mesh tip position on an analyzer symmetric axis, $d_2$ being a distance from a point source to an edge position, wherein an angle θ and θmax are deviation angles from an analyzer symmetric axis for determining a mesh surface and a mesh position, respectively, α being a function of angle θ, n being a dimensionality, and $a_1$~$a_n$ being parameters.

5. The parallel beam generation apparatus as set forth in claim 1, further comprising a planar microchannel plate which comprises a bundle of minute photomultipliers, whereby charged particles of a specific kinetic energy emitted from said planer collimator plate are amplified by an avalanche current.

6. The parallel beam generation apparatus as set forth in claim 1, further characterized in that at least one electrode is connected to said planar collimator plate, thereby allowing changes to a potential of said planar collimator plate.

7. The parallel beam generation apparatus as set forth in claim 1, further comprising a fluorescent screen, whereby an angle distribution of the charged particles of a specific kinetic energy emitted from said planar collimator plate is measurable in an image having bright spots on said fluorescent screen.

8. The parallel beam generation apparatus as set forth in claim 1, further comprising a retarding-voltage plane grid, whereby the apparatus is configured for detection of a change in current by charged particles passing through said grid, and detection of charged particles of specific kinetic energy emitted from said planar collimator plate.

9. The parallel beam generation apparatus as set forth in claim 1, further comprising a delay-line detector, whereby a time-resolution angular distribution measurement is performed by measuring an emission angle and an arrival time of an individual charged particle of a specific kinetic energy emitted from said collimator plate using said delay-line detector.

10. The parallel beam generation apparatus of claim 1 in combination with and incorporated in at least one of the following: an Electron Spectrometer, an Electron Diffraction Device, a Photoemission Spectrometer, a Photoelectron Diffraction Device, a Positron Spectrum Device, a Positron Diffraction Device, an Ion Detachment Angle Distribution Measurement System, a Crystal Structure Analyzing Device, a Material Surface Analyzing Device or a Solid State Material Physical Properties Analyzer.

11. The parallel beam generation apparatus of claim 1, in combination with and incorporated in a precision ion etching apparatus for ion etching or ion sputtering as a single-energy large-diameter ion-beam source.

12. The parallel beam generation apparatus of claim 1 in combination with and incorporated in a large solid angle X-ray detector for amplifying electrons generated at said planar collimator plate with said collimator plate setting as a minus potential and said fluorescent screen setting as a plus potential.

13. The parallel beam generation apparatus of claim 1 in combination with and incorporated in a parallel beam focusing apparatus, wherein said electrostatic lens and planar collimator plate are placed coaxially to each other so that a trajectory of a charged particle of a specific kinetic energy is substantially perpendicularly incident on said planar collimator plate when focused on said focusing point by said electrostatic lens.

14. The parallel beam focusing apparatus as set forth in claim 13, wherein said planar collimator plate is constituted with minute pores, each pore having an aspect ratio defined as a ratio of pore radius and pore length, the aspect ratio of 50% or more of said pores being in a range from 1:5 to 1:20.

15. More than one of the apparatus of claim 13 in combination with and incorporated in a charged particle flow direction/energy measurement apparatus wherein said planar collimator plate functions as a band-pass filter by selecting charged particles of a specific kinetic energy, and energy intensity of charged particles only of a specific energy is measured by focusing the particles to one point by said electrostatic lens by extracting a charged particle flow in a specific direction by said planar collimator plate.

16. The parallel beam generation apparatus of claim 1, wherein a reduction ratio is defined as a ratio of kinetic energy at a termination electrode to kinetic energy at a time of charged particle generation, the electrostatic lens further satisfying at least one of the following:

1) when the number of electrodes excluding the mesh electrode is one, a ratio of a major axis radius to minor axis radius of said spheroid is 1.69 or more and 1.89 or less-and a reduction ratio is 0.1 or more and 0.3 or less;
2) when the number of electrodes excluding the mesh electrode is two, a ratio of a major axis radius to minor axis radius of said spheroid is 1.56 or more and 1.76 or less-and a reduction ratio is 0.1 or more and 0.3 or less;
3) when the number of electrodes excluding the mesh electrode is three, a ratio of a major axis radius to minor axis radius of said spheroid is 1.52 or more and 1.72 or less-and a reduction ratio is 0.1 or more and 0.3 or less;
4) when the number of electrodes excluding the mesh electrode is four, a ratio of a major axis radius to minor axis radius of said spheroid is 1.49 or more and 1.69 or less and a reduction ratio is 0.1 or more and 0.3 or less; or
5) when the number of electrodes excluding the mesh electrode is five, a ratio of a major axis radius to minor axis radius of said spheroid is 1.39 or more and 1.59 or less and a reduction ratio is 0.1 or more and 0.3 or less.

* * * * *